(12) United States Patent
Saji

(10) Patent No.: US 12,126,323 B2
(45) Date of Patent: *Oct. 22, 2024

(54) ELASTIC WAVE DEVICE

(71) Applicant: Murata Manufacturing Co., Ltd., Nagaokakyo (JP)

(72) Inventor: Mari Saji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/240,960

(22) Filed: Aug. 31, 2023

(65) Prior Publication Data

US 2023/0412144 A1  Dec. 21, 2023

Related U.S. Application Data

(63) Continuation of application No. 16/125,800, filed on Sep. 10, 2018, now Pat. No. 11,784,626.

(30) Foreign Application Priority Data

Sep. 21, 2017 (JP) ................. 2017-181384

(51) Int. Cl.
*H03H 9/02* (2006.01)
*H03H 9/145* (2006.01)
*H03H 9/25* (2006.01)
*H10N 30/87* (2023.01)

(52) U.S. Cl.
CPC .... *H03H 9/14541* (2013.01); *H03H 9/02559* (2013.01); *H03H 9/02637* (2013.01); *H03H 9/02818* (2013.01); *H03H 9/02834* (2013.01); *H03H 9/02866* (2013.01); *H03H 9/25* (2013.01); *H10N 30/877* (2023.02)

(58) Field of Classification Search
CPC ........... H03H 9/14541; H03H 9/02559; H03H 9/02637; H03H 9/02834; H01L 41/0477
USPC ...... 310/313 R, 313 A, 313 B, 313 C, 313 D
See application file for complete search history.

(56) References Cited

PUBLICATIONS

Saji, "Elastic Wave Device", U.S. Appl. No. 16/125,800, filed Sep. 10, 2018.

*Primary Examiner* — Derek J Rosenau
(74) *Attorney, Agent, or Firm* — Keating & Bennett, LLP

(57) ABSTRACT

An elastic wave device includes a piezoelectric substrate mainly including lithium niobate, an interdigital transducer electrode provided on the piezoelectric substrate, and a dielectric film, provided on the piezoelectric substrate and covering the interdigital transducer electrode, and mainly including silicon oxide. The elastic wave device uses a Rayleigh wave. The interdigital transducer electrode includes main electrode layers that include one or more first main electrode layer made of a metal with a $C11^2/C12$ ratio greater than the $C11^2/C12$ ratio of the silicon oxide with regard to the elastic constants C11 and C12. The sum of the thicknesses of the one or more first main electrode layers is about 55% or more based on the thickness of the whole interdigital transducer electrode is about 100%.

20 Claims, 21 Drawing Sheets

ELASTIC WAVE DEVICE

CROSS REFERENCE TO RELATED APPLICATIONS

This application claims the benefit of priority to Japanese Patent Application No. 2017-181384 filed Sep. 21, 2017. The entire contents of this application are hereby incorporated herein by reference.

BACKGROUND OF THE INVENTION

1. Field of the Invention

The present invention relates to an elastic wave device, including a piezoelectric substrate mainly including lithium niobate, and using a Rayleigh wave.

2. Description of the Related Art

Various elastic wave devices using a Rayleigh wave propagating on a piezoelectric substrate mainly including lithium niobate have been proposed. Japanese Unexamined Patent Application Publication No. 2012-175315 discloses an interdigital transducer electrode provided on a LiNbO$_3$ substrate. The interdigital transducer electrode is composed of a multilayer metal film formed by stacking multiple metal layers. The interdigital transducer electrode is covered by a silicon oxide film.

In the past, a structure in which a silicon oxide film is stacked on a piezoelectric substrate mainly including lithium niobate has often been used to improve frequency-temperature characteristics. However, when the silicon oxide film has an excessively large thickness, the spurious response due to a Sezawa wave is large in some cases. When the silicon oxide film has a small thickness, frequency-temperature characteristics are poor. Thus, it is difficult to achieve both the suppression of the spurious response due to the Sezawa wave and the reduction of the absolute value of the temperature coefficient of frequency (TCF).

SUMMARY OF THE INVENTION

Preferred embodiments of the present invention provide elastic wave devices that are each capable of ensuring the reduction or prevention of the spurious response due to a Sezawa wave and the improvement of frequency-temperature characteristics.

According to a preferred embodiment of the present invention, an elastic wave device includes a piezoelectric substrate mainly including lithium niobate; an interdigital transducer electrode provided on the piezoelectric substrate; and a dielectric film, provided on the piezoelectric substrate so as to cover the interdigital transducer electrode, and mainly including silicon oxide, the elastic wave device using a Rayleigh wave. The interdigital transducer electrode includes a plurality of main electrode layers. The plurality of main electrode layers include one or more first main electrode layer made of a metal with a C11$^2$/C12 ratio greater than the C11$^2$/C12 ratio of the silicon oxide with regard to the elastic constants C11 and C12. The sum of the thicknesses of the one or more first main electrode layers is about 55% or more based on the thickness of the entire interdigital transducer electrode being about 100%.

In elastic wave devices according to preferred embodiments of the present invention, the spurious response due to a Sezawa wave is able to be reduced or prevented, frequency-temperature characteristics are able to be improved, and the ohmic loss of an interdigital transducer electrode is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described in detail with reference to the accompanying drawings.

Preferred embodiments described herein are illustrative. It is pointed out that configurations may be partially replaced or combined between different preferred embodiments.

Figure 1:
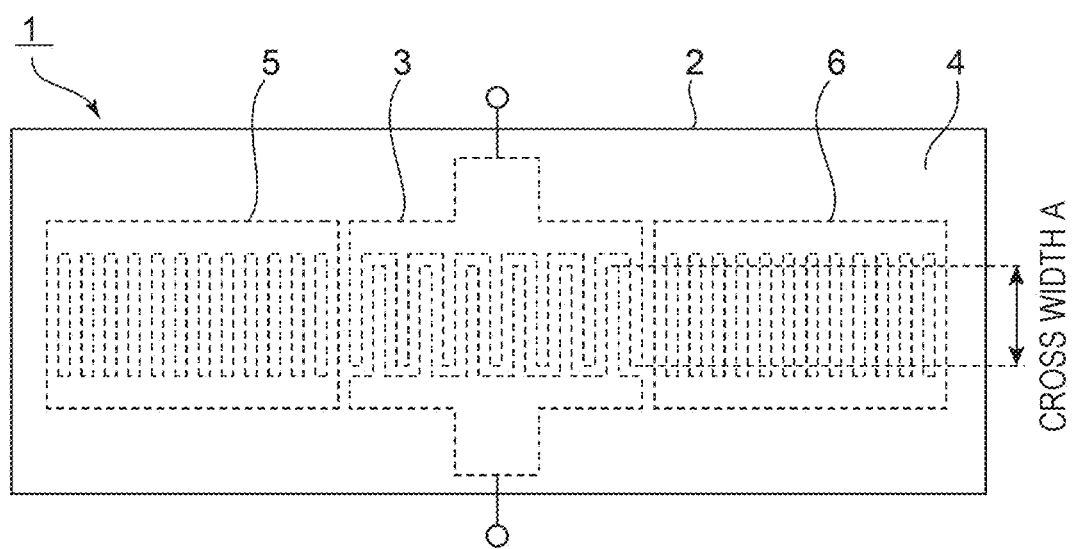
FIG. 1 is a plan view of an elastic wave device according to a first preferred embodiment of the present invention.
Figure 2:
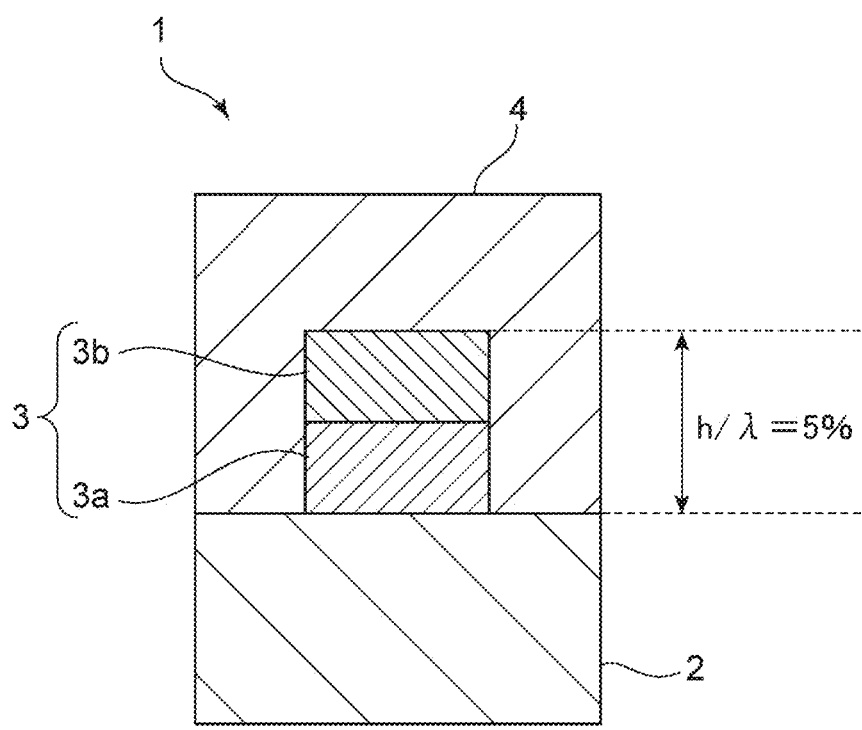
FIG. 2 is a schematic partial elevational cross-sectional view illustrating the multilayer structure of a substantial portion of the elastic wave device according to the first preferred embodiment of the present invention.

FIG. 1 is a plan view of an elastic wave device 1 according to a first preferred embodiment of the present invention. FIG. 2 is a schematic partial elevational cross-sectional view illustrating the multilayer structure of a substantial portion of the elastic wave device 1.

The elastic wave device 1 includes a piezoelectric substrate 2. The piezoelectric substrate 2 is preferably made of rotated Y-cut X-propagation LiNbO₃, for example. An interdigital transducer electrode 3 is provided on the piezoelectric substrate 2. Reflectors 5 and 6 are provided on both sides of the interdigital transducer electrode 3. A dielectric film 4 mainly including silicon oxide is provided on the piezoelectric substrate 2 so as to cover the interdigital transducer electrode 3 and the reflectors 5 and 6. The interdigital transducer electrode 3 includes at least two main electrode layers. In the interdigital transducer electrode 3, preferably, a second main electrode layer 3b made of Ag is stacked on a first main electrode layer 3a made of Mo, for example. The elastic wave device 1 uses a Rayleigh wave propagating on the piezoelectric substrate 2. The term "main electrode layer" refers to a high-density electrode layer exciting a Rayleigh wave or an electrode layer that compensates for resistance in order to ensure good characteristics of an elastic wave. Thus, the interdigital transducer electrode 3 may include an adhesion layer or an anti-diffusion layer in addition to the main electrode layers. The adhesion layer is an electrode layer that increases the adhesion of the interdigital transducer electrode 3 to the piezoelectric substrate 2 and may preferably be made of, for example, Ni—Cr or Ti. The anti-diffusion layer is an electrode layer that prevents the diffusion of atoms between the main electrode layers and may preferably be made of, for example, Ti.

The piezoelectric substrate 2 is not limited to LiNbO₃ and may be a piezoelectric substrate mainly including lithium niobate. The piezoelectric substrate mainly including lithium niobate is a piezoelectric substrate including about 50% or more lithium niobate.

The dielectric film 4 is preferably a film mainly including silicon oxide, for example. The film mainly including silicon oxide is not limited to a SiO₂ film and is a film including about 50% or more silicon oxide.

The elastic wave device 1 includes the piezoelectric substrate 2, which mainly includes lithium niobate; the interdigital transducer electrode 3, which is provided on the piezoelectric substrate 2; and the dielectric film 4, which is provided on the piezoelectric substrate 2 and cover the interdigital transducer electrode 3 and mainly includes silicon oxide, and uses a Rayleigh wave. The interdigital transducer electrode 3 includes multiple main electrode layers. The multiple main electrode layers preferably include one or more first main electrode layers made of a metal with a C11²/C12 ratio greater than the C11²/C12 ratio of silicon oxide included in the dielectric film 4 with regard to the elastic constants C11 and C12. The sum of the thicknesses of the one or more first main electrode layers is preferably about 55% or more based on the thickness of the entire interdigital transducer electrode 3 being about 100%. This enables the reduction or prevention of a spurious response due to the Sezawa wave, the improvement of frequency-temperature characteristics, and the reduction in ohmic loss of the interdigital transducer electrode 3. This is described below in detail.

The term "elastic constant" refers to elastic stiffness. Supposing that i, j, k, and l are defined as variables representing the x-axis, the y-axis, and the z-axis, the elastic stiffness is $C_{ijkl}$ in the equation $T_{ij}=C_{ijkl}S_{kl}$ (i, j, k, l=x, y, z), where $T_{ij}$ is the stress acting on the i-plane in a j-direction and $S_{kl}$ is the strain given by the k differentiation of the displacement $U_1$ at a certain position a as represented by the following equation:

$$S_{kl} = \frac{1}{2}\left(\frac{\delta U_l}{\delta k} + \frac{\delta U_k}{\delta l}\right)$$

Since $T_{ij}$ and $S_{kl}$ are usually second-rank tensors, $C_{ijkl}$ is a fourth-rank tensor. Using the substitutions xx=1, yy=2, zz=3, yz(zy)=4, zx(xz)=5, and xy(yx)=6 allows $C_{xxxx}$ to be expressed as C11.

Herein, an x-direction is the propagation direction of an elastic wave.

Figure 3:
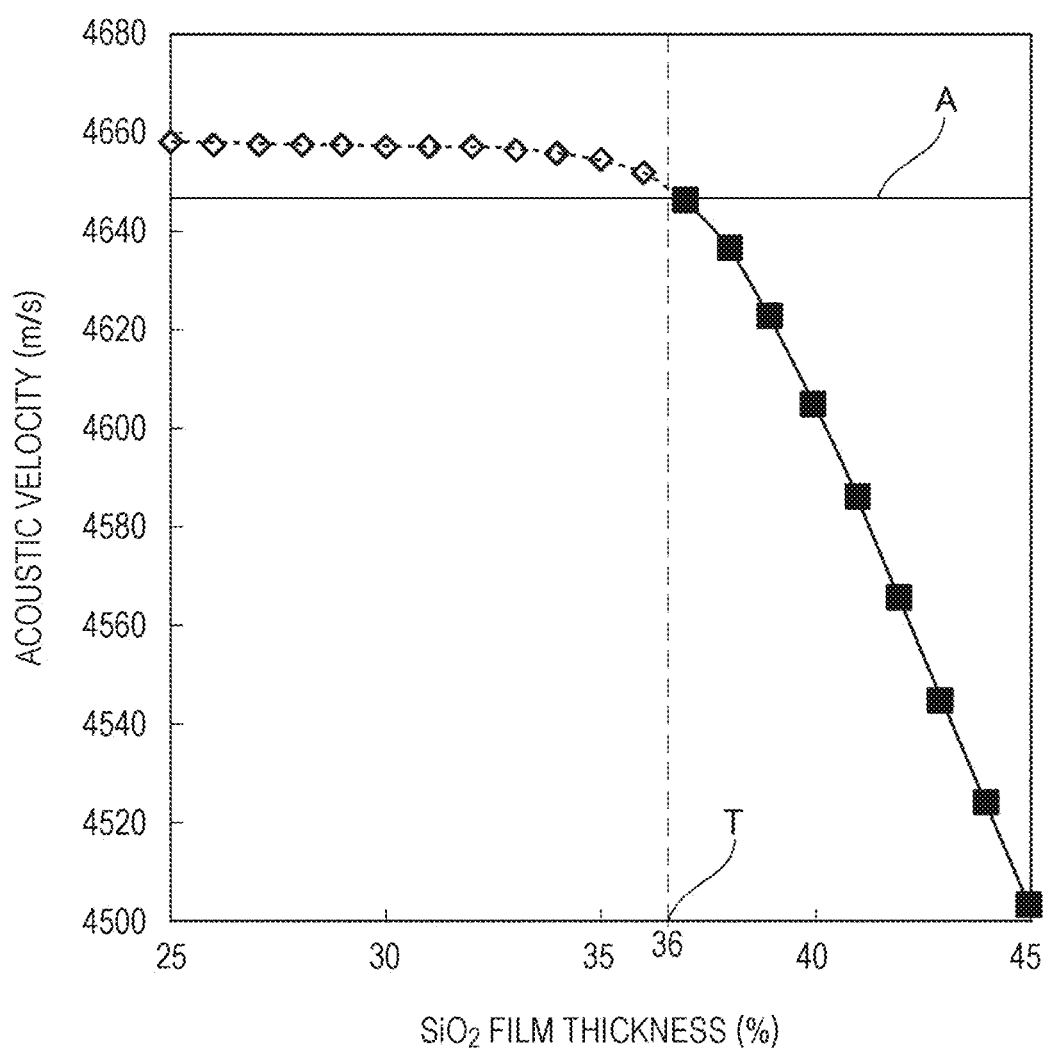
FIG. 3 is a graph showing the relationship between the thickness (%) of each SiO$_2$ film and the acoustic velocity of a Sezawa wave.

The acoustic velocity of the Sezawa wave varies depending on the thickness of the dielectric film 4. When the thickness of the dielectric film 4 is small, the acoustic velocity of the Sezawa wave is high. When the thickness of the dielectric film 4 is large, the acoustic velocity of the Sezawa wave is low. FIG. 3 is a graph showing the relationship between the thickness (%) of each SiO₂ film and the acoustic velocity of the Sezawa wave in the case of using SiO₂ as the dielectric film 4.

The thickness (%) of the SiO₂ film is the percentage (%) relative to the wavelength determined by the pitch between electrode fingers of the interdigital transducer electrode 3, that is, the wavelength-normalized thickness.

In FIG. 3, Continuous Line A represents the acoustic velocity VB of a bulk wave propagating on the piezoelectric substrate 2, which is made of LiNbO$_3$, that is, a fast transversal wave, where VB=about 4,647 m/s. In FIG. 3, ■ represents the Sezawa wave and a plot of ◇ shows a state in which the Sezawa wave is cut off to a bulk wave. When the acoustic velocity is greater than about 4,647 m/s, the Sezawa wave is cut off to a bulk wave and is not excited, which is plotted with the symbol ◇.

As shown in FIG. 3, the acoustic velocity of the Sezawa wave decreases with the increase in thickness (%) of the SiO$_2$ film. Suppose that the acoustic velocity of the Sezawa wave is VS. When VS>VB, the Sezawa wave is cut off to a bulk wave and is not excited. Suppose that the thickness of the SiO$_2$ film when VS=VB is a film thickness T. When the thickness of the SiO$_2$ film is less than the film thickness T, the Sezawa wave is not excited. In FIG. 3, the film thickness T is equal to about 36%, for example.

When the thickness of the SiO$_2$ film is less than the film thickness T, the spurious due to the Sezawa wave is significantly reduced.

If the acoustic velocity VS of the Sezawa wave is able to be increased, then the film thickness T is able to be increased. Thus, even in the case of using a SiO$_2$ film with a smaller thickness, the spurious response due to the Sezawa wave is able to be reduced. On the other hand, increasing the thickness of a SiO$_2$ film enables the absolute value of the TCF of the elastic wave device 1 to be reduced. Therefore, it is conceivable that the reduction or prevention of the spurious response due to the Sezawa wave and good frequency-temperature characteristics, that is, the reduction of the absolute value of the TCF are both able to be achieved.

The inventor of preferred embodiments of the present invention has performed various investigations about the acoustic velocity of a Sezawa wave and, as a result, has discovered that the following metals are present: metals that are able to increase the acoustic velocity of the Sezawa wave to reduce or prevent the Sezawa wave in the case of increasing the thickness of a film and metals that reduce the acoustic velocity of the Sezawa wave to increase the Sezawa wave. The inventor of preferred embodiments of the present invention has developed preferred embodiments of the present invention based on these discoveries.

FIGS. 4 to 12 are graphs showing the relationship between the thickness (%) of each SiO$_2$ film and the acoustic velocity of a Sezawa wave when metal included in an interdigital transducer electrode is Mo, W, Cu, Fe, Pt, Ta, Al, Ag, or Au. FIGS. 4 to 12 show the dependence of the acoustic velocity of the Sezawa wave on the thickness of a SiO$_2$ film when the film thickness (%) of metal included in an interdigital transducer electrode is varied.

Incidentally, the film thickness (%) of metal is the percentage (%) relative to the wavelength determined by the pitch between the electrode fingers of the interdigital transducer electrode 3, that is, the wavelength-normalized thickness.

In FIGS. 4 to 12, the acoustic velocity VB of the bulk wave is represented by Continuous Line A.

Figure 4:
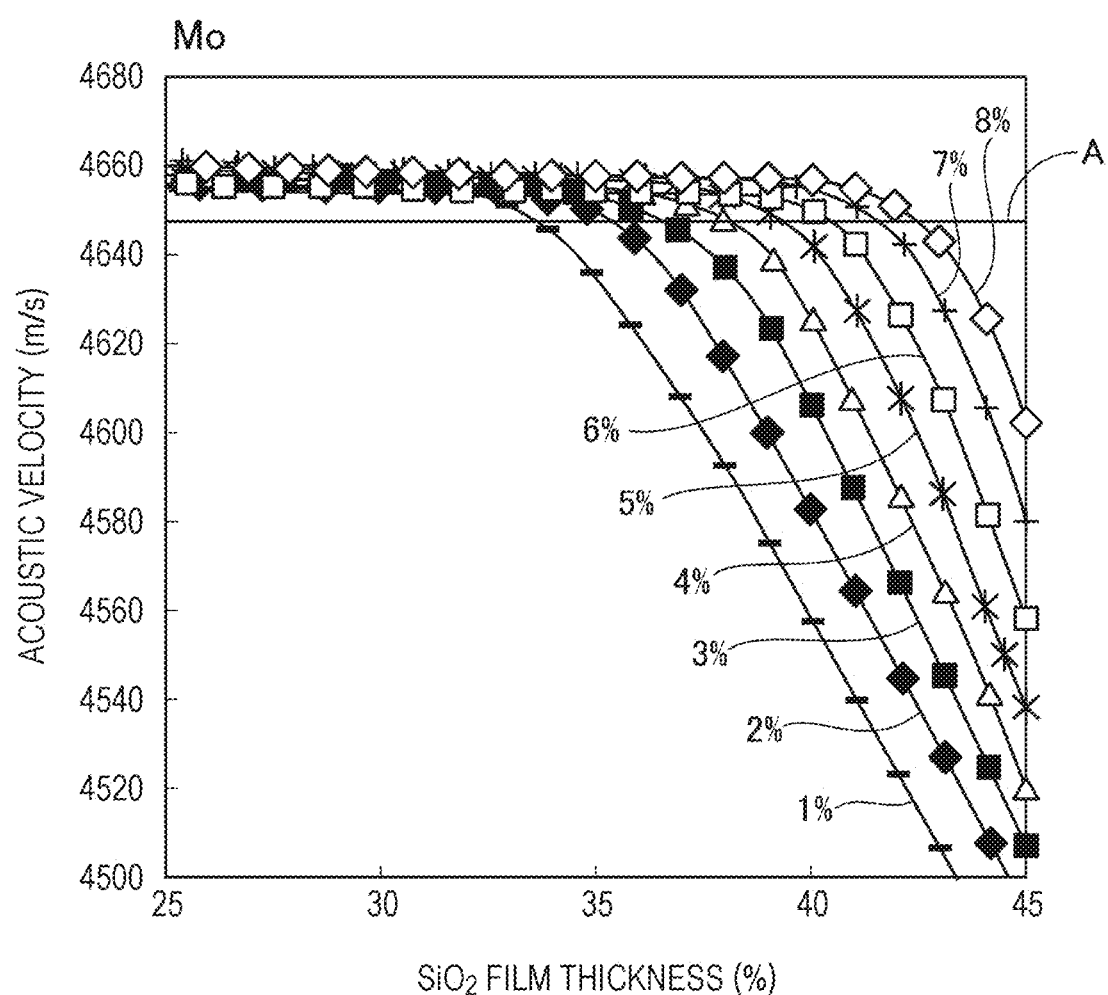
FIG. 4 is a graph showing the relationship between the thickness of each SiO$_2$ film and the acoustic velocity of a Sezawa wave in the case of using interdigital transducer electrodes, made of Mo, and having various thicknesses.

For example, as shown in FIG. 4, it is clear that when an interdigital transducer electrode is made of Mo, the thickness of a SiO$_2$ film that enables the acoustic velocity of the Sezawa wave to be less than the acoustic velocity of the bulk wave increases as the thickness of a Mo film increases from about 1% to about 8%. Thus, as the thickness of the Mo film is increased, the film thickness T for the SiO$_2$ film is increased when VS=VB. Therefore, it is clear that in the case of using a main electrode layer made of Mo, increasing the thickness of a Mo film enables the spurious response due to the Sezawa wave to be reduced or prevented and also enables frequency-temperature characteristics to be improved.

Figure 5:
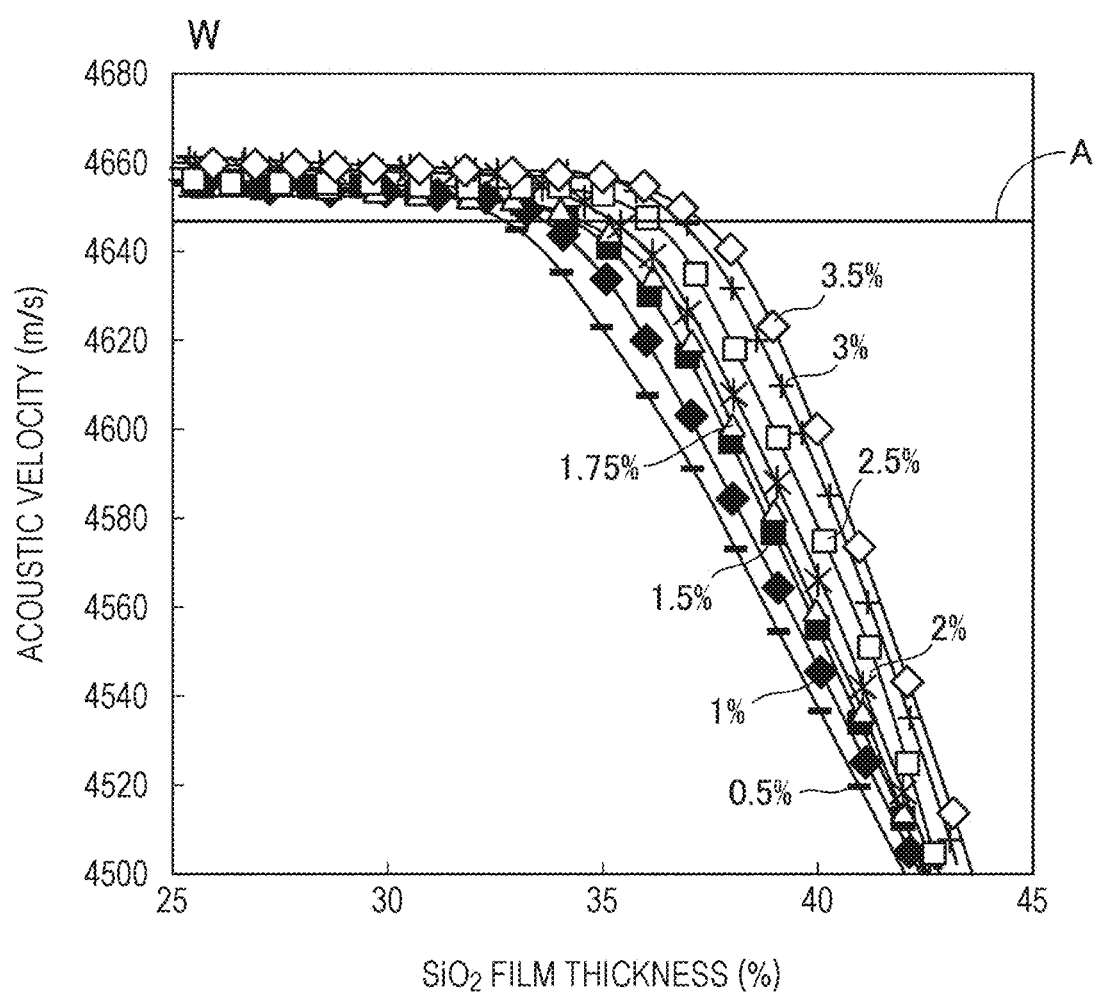
FIG. 5 is a graph showing the relationship between the thickness of each SiO$_2$ film and the acoustic velocity of a Sezawa wave in the case of using interdigital transducer electrodes, made of W, and having various thicknesses.
Figure 6:
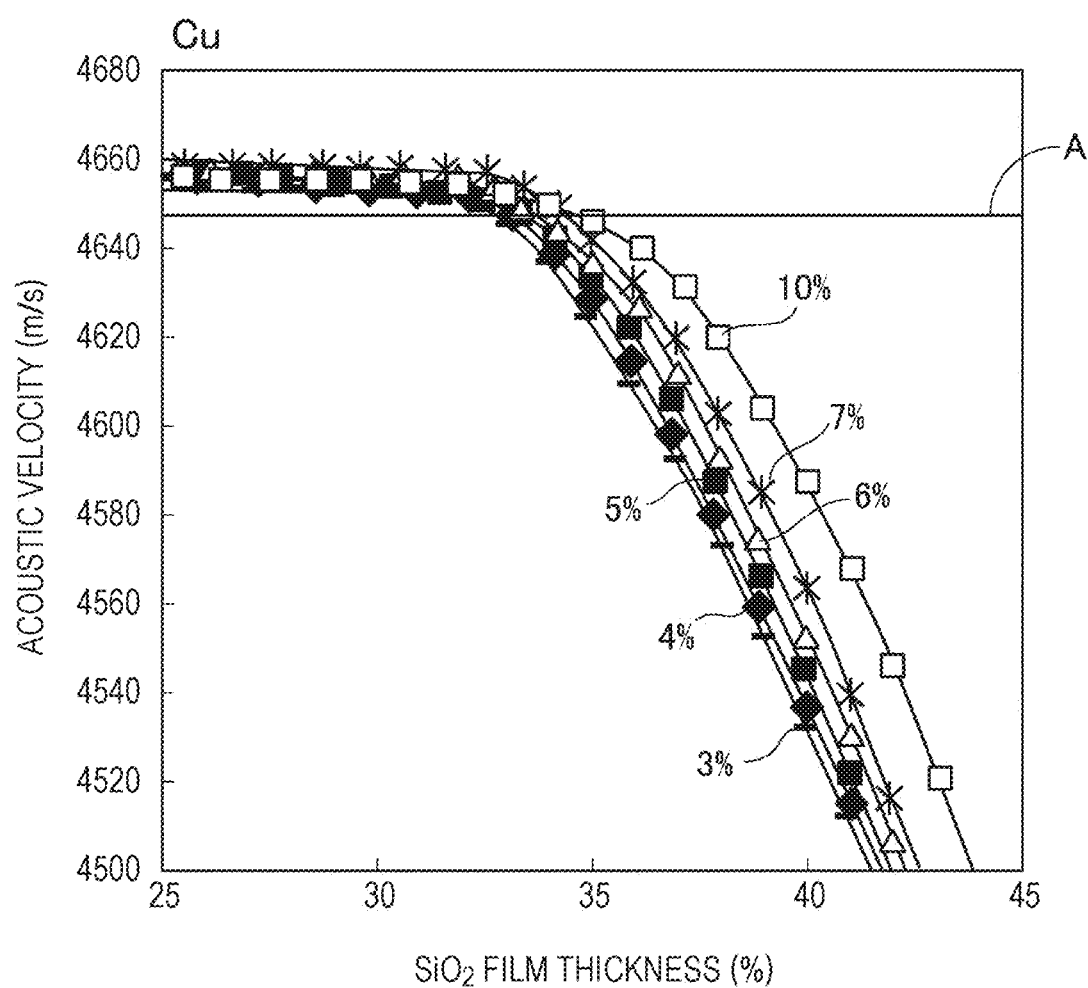
FIG. 6 is a graph showing the relationship between the thickness of each SiO$_2$ film and the acoustic velocity of a Sezawa wave in the case of using interdigital transducer electrodes, made of Cu, and having various thicknesses.
Figure 7:
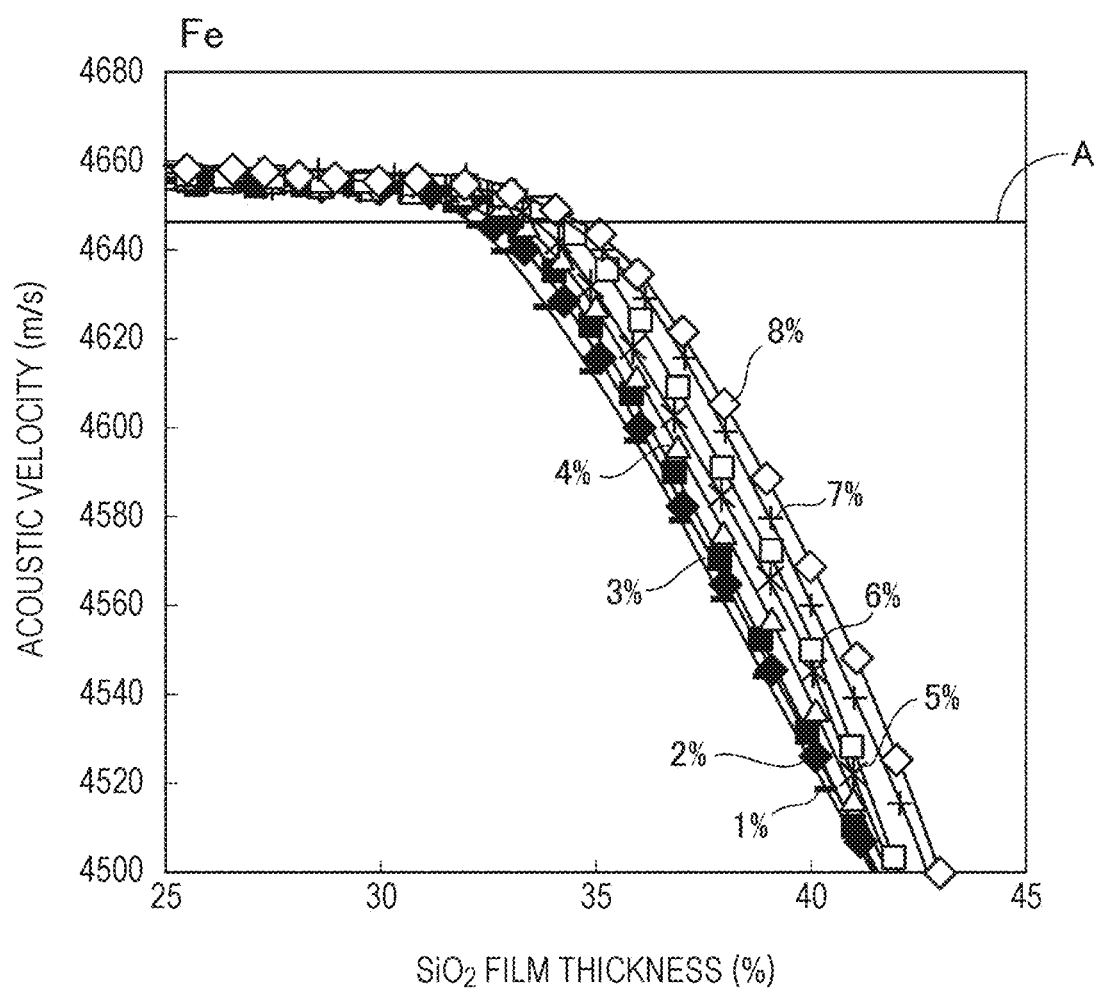
FIG. 7 is a graph showing the relationship between the thickness of each SiO$_2$ film and the acoustic velocity of a Sezawa wave in the case of using interdigital transducer electrodes, made of Fe, and having various thicknesses.
Figure 8:
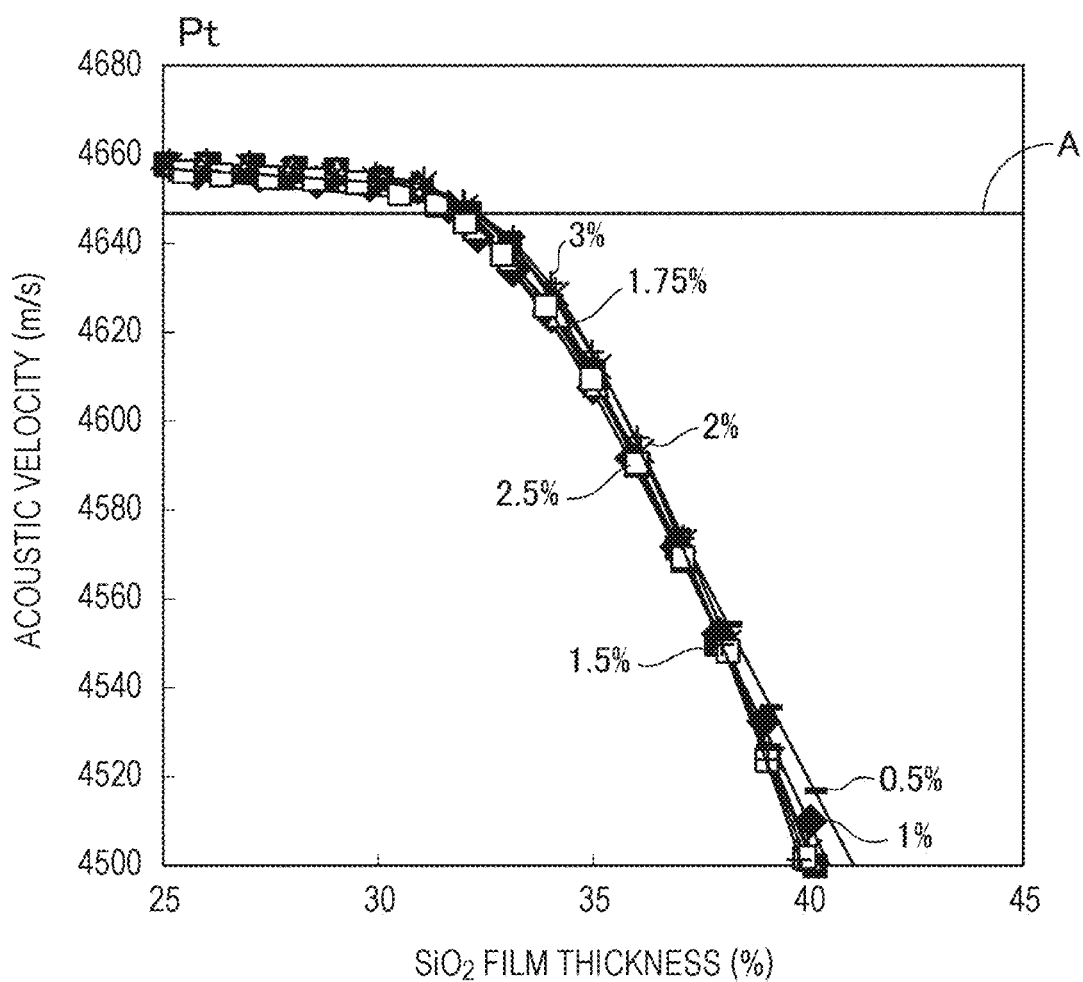
FIG. 8 is a graph showing the relationship between the thickness of each SiO$_2$ film and the acoustic velocity of a Sezawa wave in the case of using interdigital transducer electrodes, made of Pt, and having various thicknesses.
Figure 9:
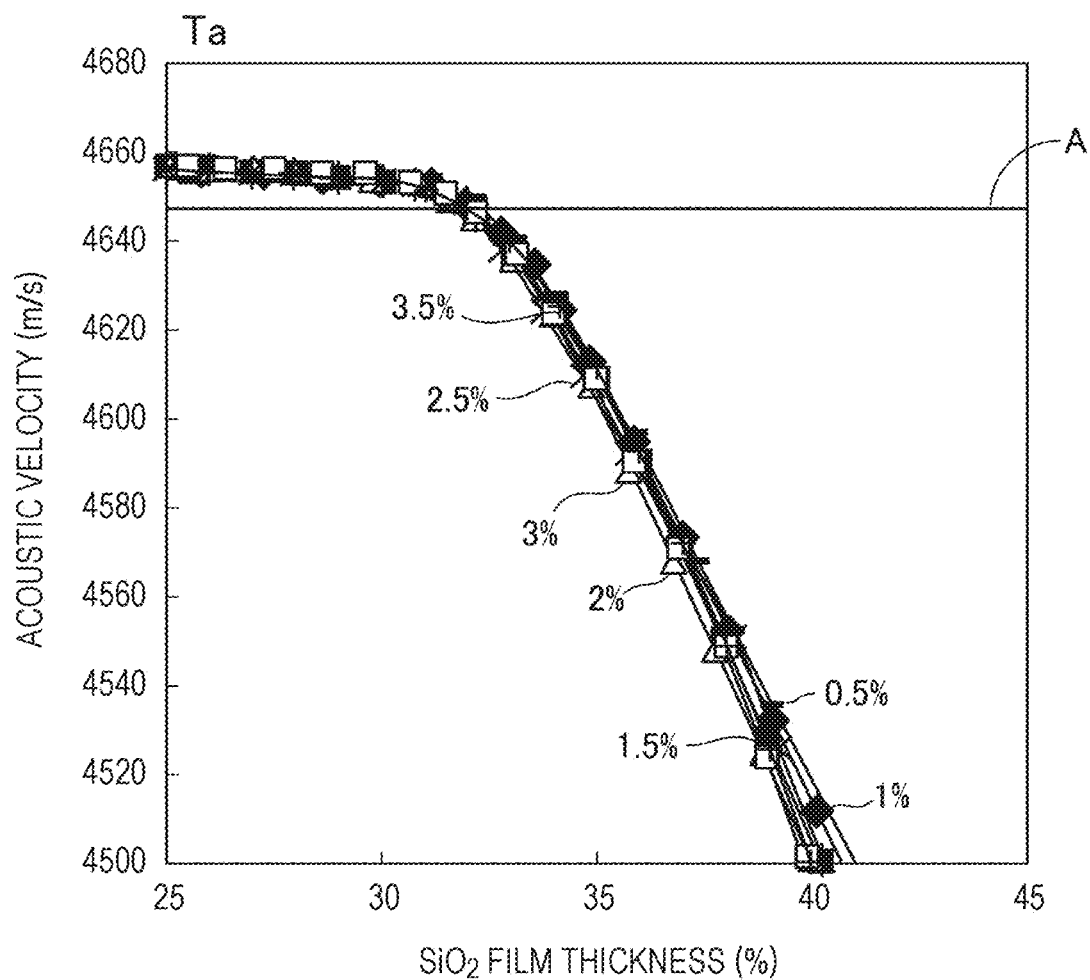
FIG. 9 is a graph showing the relationship between the thickness of each SiO$_2$ film and the acoustic velocity of a Sezawa wave in the case of using interdigital transducer electrodes, made of Ta, and having various thicknesses.

In the case of W, Cu, and Fe, as well as the case of Mo, as shown in FIG. 5, FIG. 6, and FIG. 7, respectively, increasing the thickness of these metals increases the film thickness T. On the other hand, in the case of Pt and Ta, as shown in FIG. 8 and FIG. 9, respectively, increasing the thickness thereof only slightly increases the film thickness T.

Figure 10:
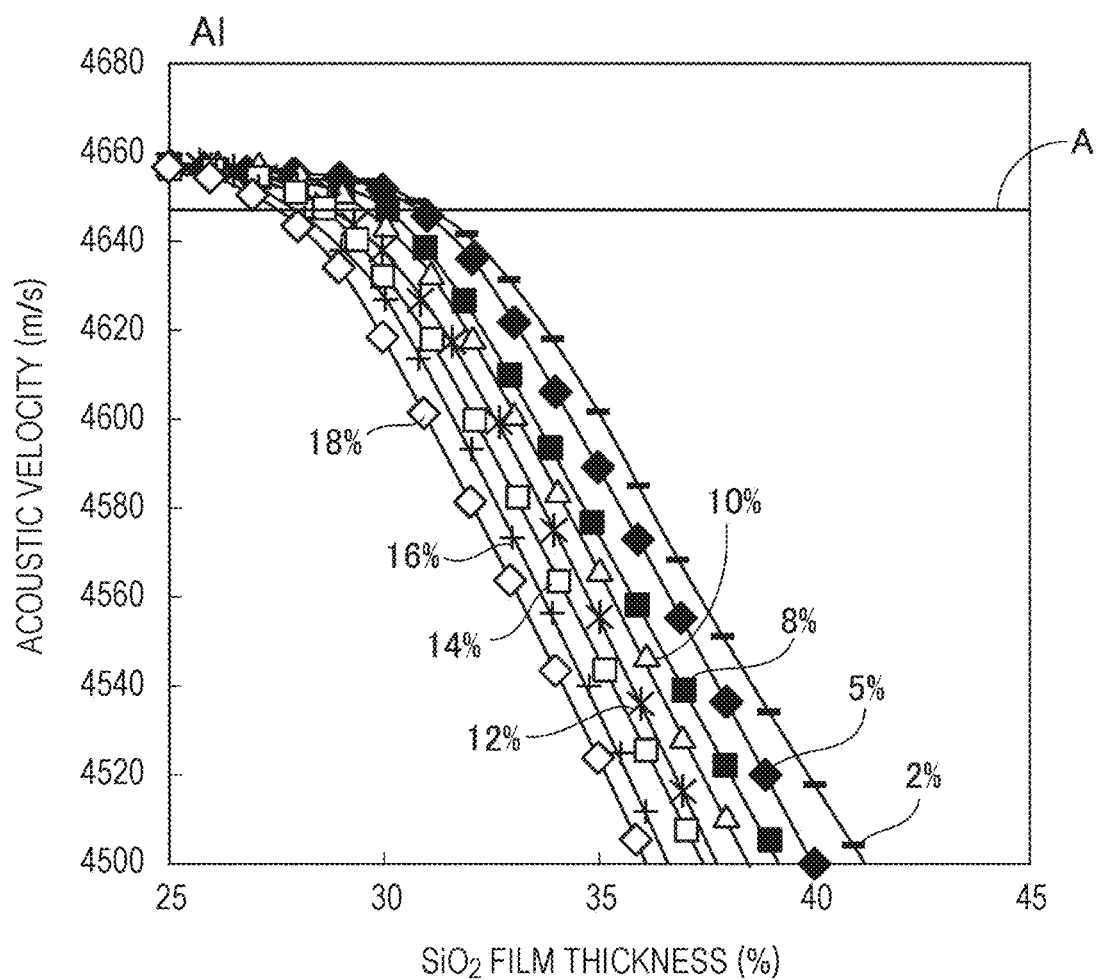
FIG. 10 is a graph showing the relationship between the thickness of each SiO$_2$ film and the acoustic velocity of a Sezawa wave in the case of using interdigital transducer electrodes, made of Al, and having various thicknesses.
Figure 11:
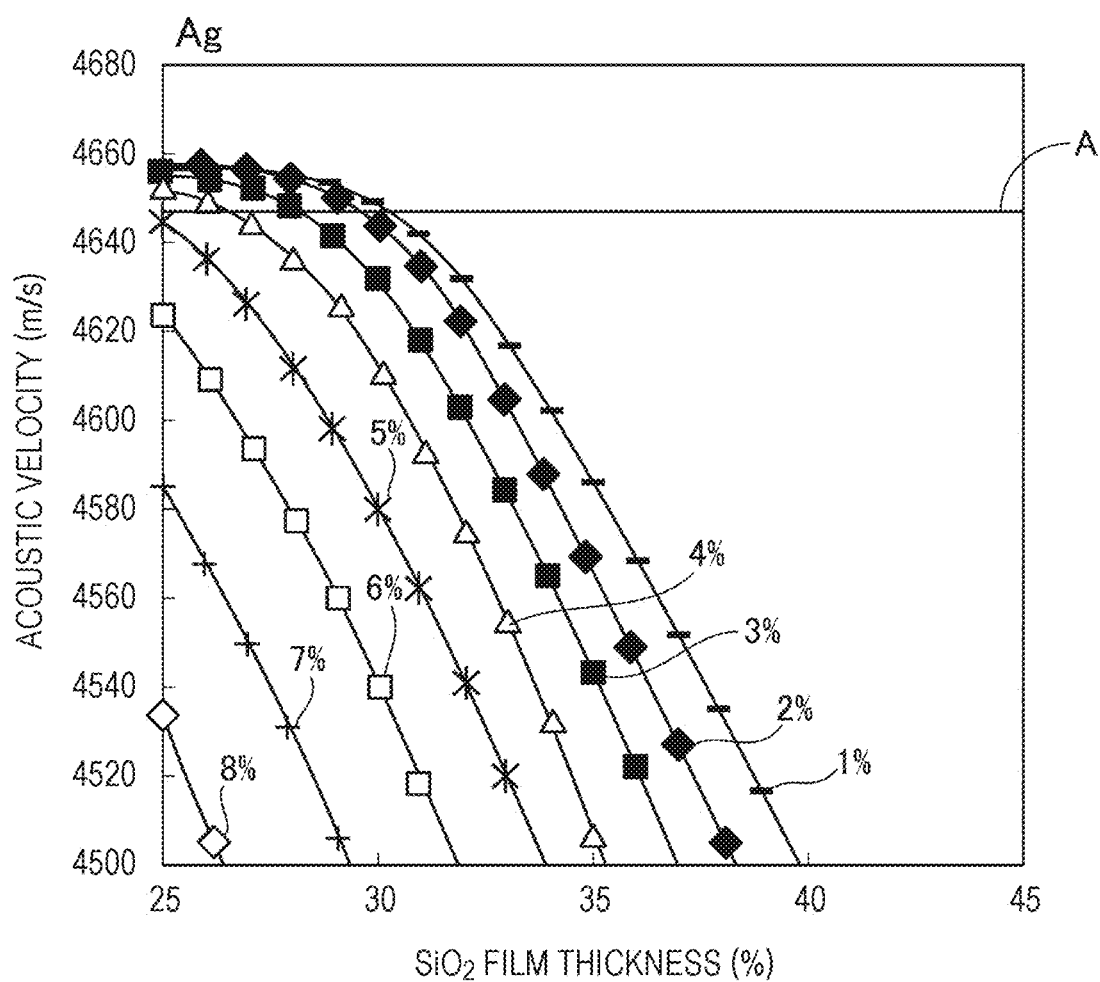
FIG. 11 is a graph showing the relationship between the thickness of each SiO$_2$ film and the acoustic velocity of a Sezawa wave in the case of using interdigital transducer electrodes, made of Ag, and having various thicknesses.
Figure 12:
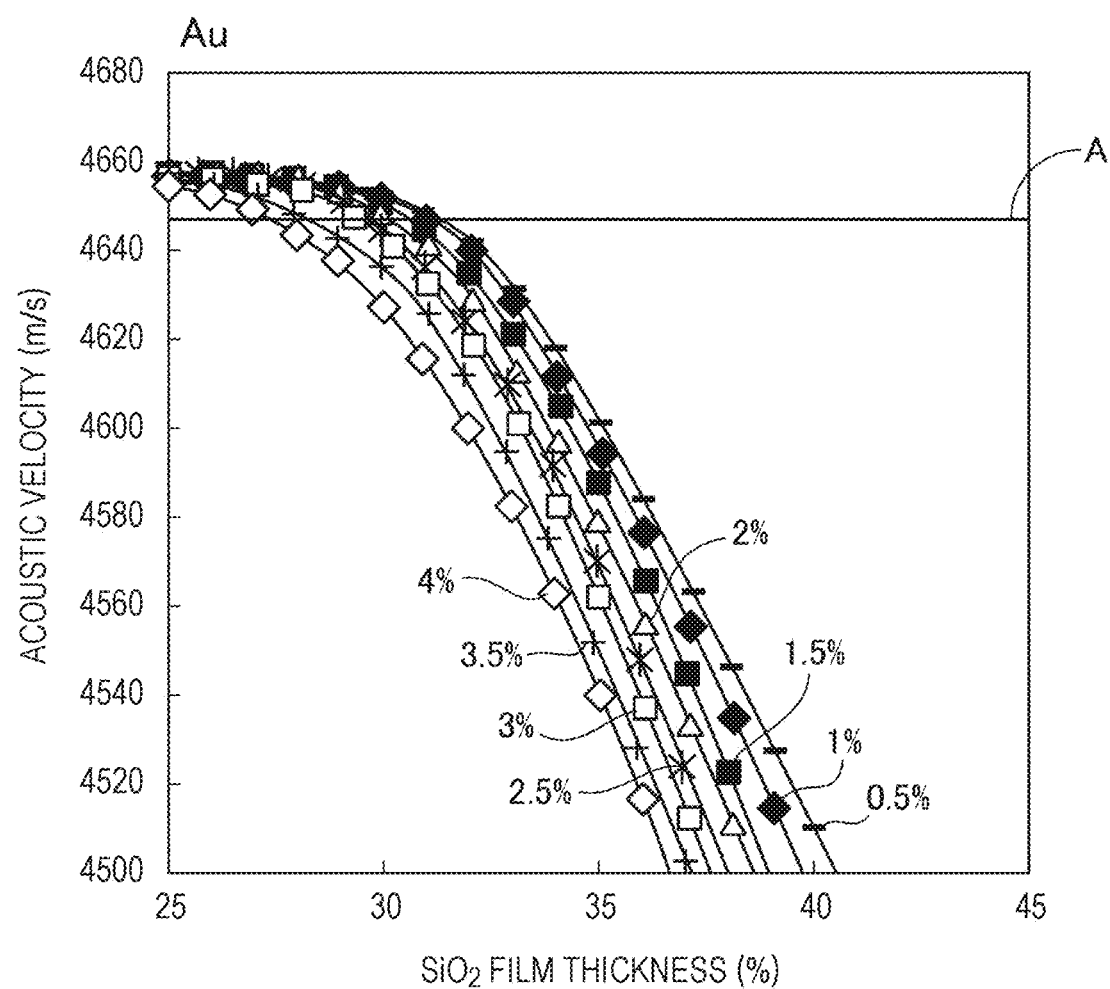
FIG. 12 is a graph showing the relationship between the thickness of each SiO$_2$ film and the acoustic velocity of a Sezawa wave in the case of using interdigital transducer electrodes, made of Au, and having various thicknesses.

In contrast, in the case of Al, as shown in FIG. 10, increasing the thickness thereof decreases the film thickness T. In the case of Ag, as shown in FIG. 11, increasing the thickness thereof decreases the film thickness T. Similarly, in the case of Au, as shown in FIG. 12, increasing the thickness thereof decreases the film thickness T.

As is clear from FIGS. 4 to 9, when using Mo, W, Cu, Fe, Pt, or Ta, increasing the thickness thereof enables the film thickness T to be increased. Thus, the reduction or prevention of the spurious response due to the Sezawa wave and the reduction of the absolute value of the temperature coefficient of frequency (TCF) are both able to be achieved.

If the thickness of a metal film included in an interdigital transducer electrode is able to be increased, the ohmic loss of the interdigital transducer electrode is able to be prevented from being caused or decreased. Therefore, using Mo as a main electrode layer of the interdigital transducer electrode and increasing the thickness of the interdigital transducer electrode enable the reduction or prevention of the spurious response due to the Sezawa wave, the improvement of frequency-temperature characteristics, and the reduction in ohmic loss of the interdigital transducer electrode.

As is the case of Mo, using W, Cu, Fe, Pt, or Ta as the main electrode layer of the interdigital transducer electrode and increasing the thickness of the interdigital transducer electrode also enable the reduction or prevention of the spurious response due to the Sezawa wave, the improvement of frequency-temperature characteristics, and the reduction in ohmic loss of the interdigital transducer electrode.

As is clear from FIGS. 4 to 9, from the viewpoint of reducing or preventing the spurious response due to the Sezawa wave, the viewpoint of improving frequency-temperature characteristics, and the viewpoint of reducing the ohmic loss of the interdigital transducer electrode, it is most effective to use Mo to make the main electrode layer of the interdigital transducer electrode. A second effective material is W, Cu, or Fe, for example.

In the case of using Al, as shown in FIG. 10, increasing the thickness of an Al film reduces the film thickness T. Thus, as described above, the reduction in thickness of the metal film if the interdigital transducer electrode causes the ohmic loss of the interdigital transducer electrode. Thus, using Al as the main electrode layer of the interdigital transducer electrode causes the ohmic loss of the interdigital transducer electrode.

Therefore, it is relatively difficult to achieve the reduction or prevention of the spurious response due to the Sezawa wave, the improvement of frequency-temperature characteristics, and the reduction in ohmic loss of the interdigital transducer electrode using Al only.

However, even in the case of the Al film, if the thickness thereof is selected, the spurious response due to the Sezawa wave is able to be reduced or prevented and frequency-temperature characteristics are able to be improved. For example, when the thickness of the Al film is small, for example, about 5% or about 2%, the film thickness T is equal to about 31%. Thus, the spurious response due to the Sezawa wave is able to be reduced or prevented and the absolute value of the temperature coefficient of frequency (TCF) is able to be reduced. However, as described above, the reduction in thickness of the Al film may possibly cause an increase in ohmic loss or a reduction in electric power handling capability.

In the case of using Ag, as shown in FIG. 11, when the thickness of an Ag film is about 1% or about 2%, the film thickness T is equal to about 31%. Therefore, though the spurious due to the Sezawa wave is able to be reduced or prevented and the absolute value of the temperature coefficient of frequency (TCF) is able to be reduced, the reduction in thickness thereof increases the ohmic loss of the interdigital transducer electrode. In the case of Ag, when the thickness of the Ag film is more than about 5%, the film thickness T is not present in a range in which the thickness of a $SiO_2$ film is about 25% or more. Thus, it is difficult to reduce the absolute value of the temperature coefficient of frequency (TCF).

In the case of Au, as shown in FIG. 12, when the thickness of an Au film is small, for example, about 1.5% or less, the film thickness T is equal to about 31% to about 32%. However, when the thickness of the Au film is large, about 4%, the film thickness T is small, about 27%. That is, even in the case of Au, the reduction in thickness of a metal film increases the ohmic loss of the interdigital transducer electrode.

As is clear from FIGS. 10 to 12, in the case of using Al, Ag, or Au, increasing the thickness of the Al, Ag, or Au film reduces the film thickness T. Therefore, it is difficult to achieve all of the reduction or prevention of the spurious response due to the Sezawa wave, the improvement of frequency-temperature characteristics, and the reduction in ohmic loss of the interdigital transducer.

Figure 13:
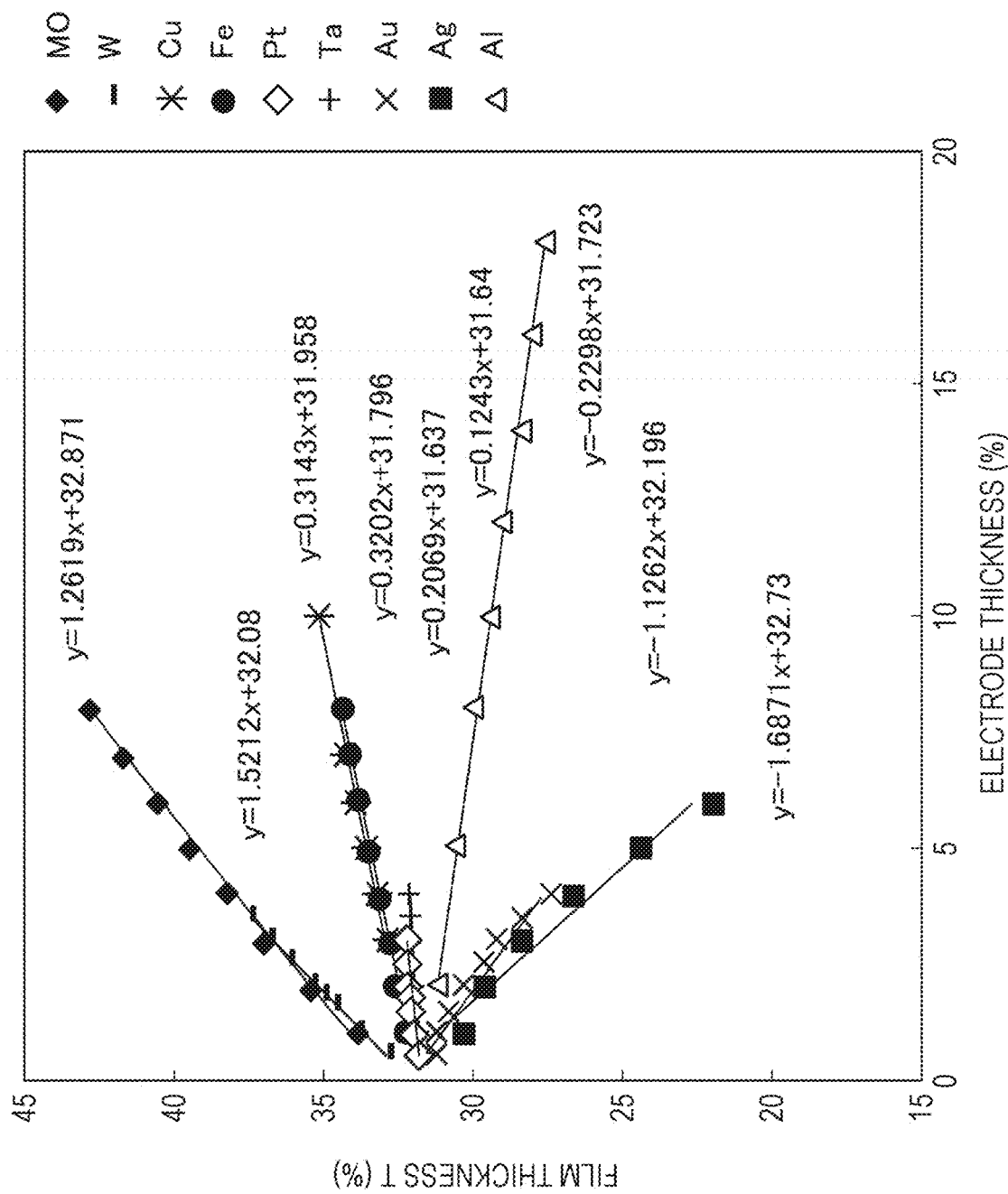
FIG. 13 is a graph showing the relationship between the thickness (%) of each electrode film and the film thickness T (%) for a SiO$_2$ film in the case of using interdigital transducer electrodes made of various metals.

FIG. 13 shows the relationship between the thickness (%) of each electrode film and the film thickness T in the case in which metal from which an electrode is made is Mo, W, Cu, Fe, Pt, Ta, Al, Ag, or Au, for example.

FIG. 13 corresponds to a plot of results shown in FIGS. 4 to 12. A straight line has been obtained by approximating results plotted for each metal. That is, the film thickness T (%) has been set to y, the thickness (%) of each electrode film has been set to x, and the slope of a straight line obtained by approximation has been determined. As is clear from FIG. 13, the slope of the straight line is positive for Mo, W, Cu, Fe, and Pt and the slope of the straight line is negative for Al, Ag, and Au. That is, in the case in which the film thickness T (%) is set to y and the thickness (%) of an electrode film is set to x, when the slope of a straight line obtained by approximation is positive, increasing the thickness of a metal film enables the film thickness T to be increased. Therefore, it is clear that the spurious response due to the Sezawa wave is able to be reduced or prevented, frequency-temperature characteristics are able to be improved, and the ohmic loss of the interdigital transducer electrode is able to be reduced. Alternatively, when the slope of the straight line is negative, it is difficult to achieve all of the reduction or prevention of the spurious due to the Sezawa wave, the improvement of frequency-temperature characteristics, and the reduction in ohmic loss of the interdigital transducer.

As is clear from FIG. 13, Mo, W, Cu, Fe, Pt, or Ta, for example, is preferably used for the main electrode layer and Mo, W, Cu, and Fe, for example, are more preferably used.

Figure 14:
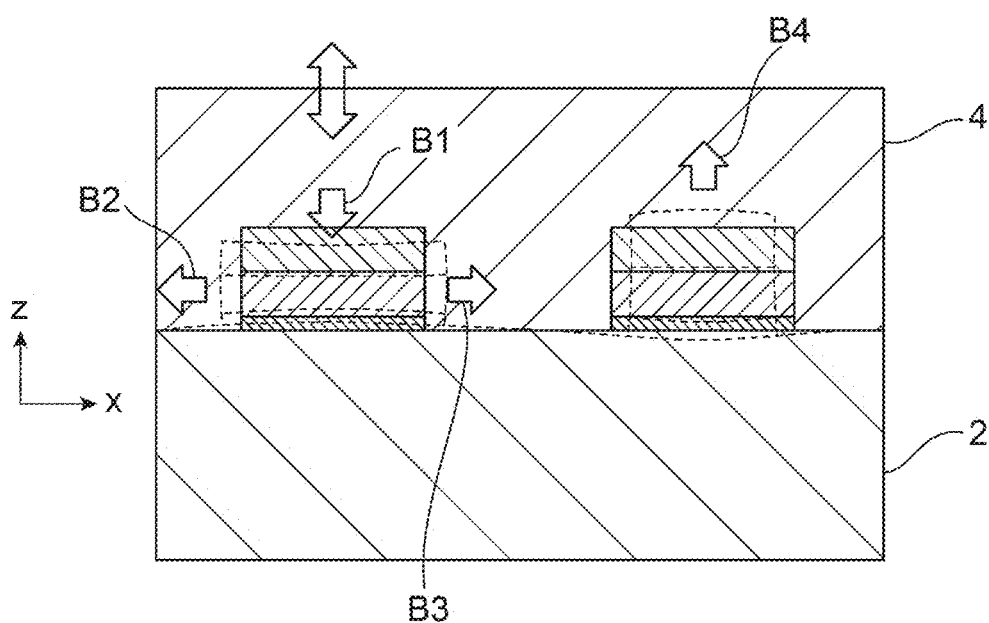
FIG. 14 is a schematic elevational cross-sectional view illustrating the displacement state of an interdigital transducer electrode due to a Sezawa wave.

The reason why increasing the thickness of the metal film included in the interdigital transducer electrode increases or reduces the acoustic velocity of the Sezawa wave in some cases is probably because of the displacement of the interdigital transducer electrode due to the Sezawa wave. FIG. 14 is a schematic elevational cross-sectional view illustrating a displacement state near the electrode fingers of the interdigital transducer electrode 3 of the elastic wave device 1.

The electrode fingers of the interdigital transducer electrode 3 are located on the piezoelectric substrate 2 as shown in FIG. 14. The $SiO_2$ film covers the interdigital transducer electrode 3. In FIG. 14, a continuous line indicates an unoperated state and a dashed line indicates a displacement state due to the Sezawa wave in an operated state. A displacement state on the left side of FIG. 14 and a displacement state on the right side thereof are repeated. In the displacement state on the left side, a transverse central portion of each electrode finger of the interdigital transducer electrode 3 contracts as indicated by Arrow B1 and the transverse size thereof expands as indicated by Arrows B2 and B3. In the displacement state on the left side of FIG. 14, the transverse size decreases and the through-thickness size increases as indicated by Arrow B4. In FIG. 14, X represents the propagation direction of an elastic wave and Z represents a direction perpendicular or substantially perpendicular to the propagation direction thereof and a direction perpendicular or substantially perpendicular to the upper surface of the piezoelectric substrate 2.

The displacement indicated by Arrows B2 and B3 in FIG. 14 is the displacement in the same direction as the propagation direction X and, therefore, the amount of displacement depends on the elastic constant C11. On the other hand, the displacement indicated by Arrows B1 and B4 is the displacement in a Z-direction perpendicular or substantially perpendicular to the propagation direction X and, therefore, the amount of displacement depends on the elastic constant C12.

Thus, using a material which is unlikely to be deformed when force is applied in the propagation direction X and which is likely to be deformed in the Z-direction, which is a thickness direction, enables the excitation of the Sezawa wave to be reduced or prevented. The resistance to deformation in a direction in which force is applied depends on the elastic constant C11 (GPa). The resistance to deformation in a direction perpendicular or substantially perpendicular to a direction in which force is applied depends on the elastic constant C12 (GPa). Therefore, the inventor of preferred embodiments of the present invention has discovered that using a metal with a $C11^2/C12$ ratio exceeding a certain threshold enables the reduction or prevention of the spurious response due to the Sezawa wave, the increase in film thickness T of the silicon oxide film, and the reduction in ohmic loss of an interdigital transducer electrode.

Figure 15:
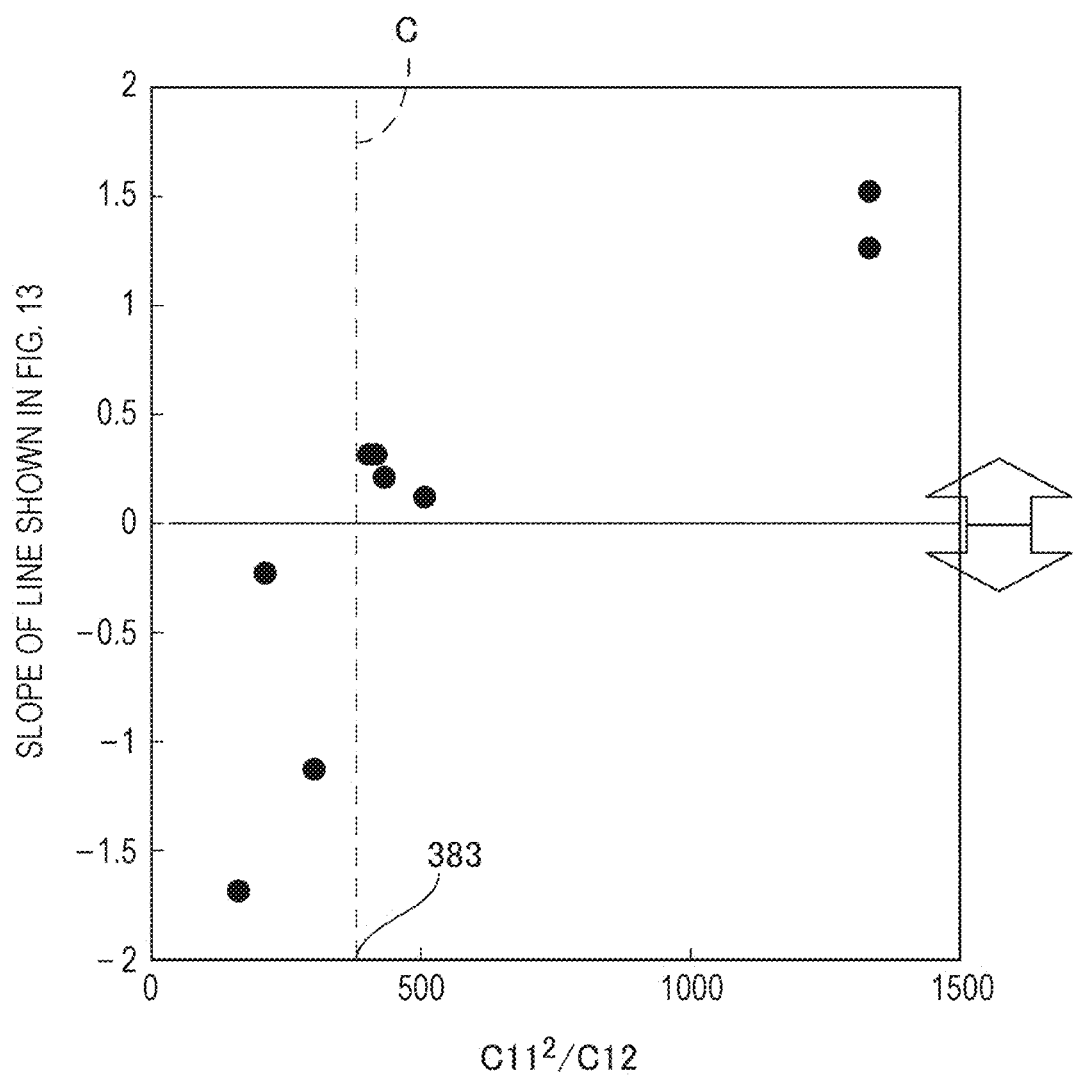
FIG. 15 is a graph showing the relationship between the C11$^2$/C12 ratio and the slope of each straight line shown in FIG. 13.

FIG. 15 is a graph showing the relationship between the $C11^2/C12$ ratio and the slope of each straight line shown in FIG. 13. Dashed Line C in FIG. 15 indicates the $C11^2/C12$ ratio of silicon oxide ($SiO_2$) that is equal to about 383. As is clear from FIG. 15, in a metal with a $C11^2/C12$ ratio of more than about 383, the slope of the straight line is positive and, in a metal with a $C11^2/C12$ ratio of less than about 383, the slope of the straight line is negative. Thus, when using a metal with a $C11^2/C12$ ratio greater than the $C11^2/C12$ ratio of silicon oxide as a main electrode layer of an interdigital transducer electrode, increasing the thickness of the main electrode layer enables the reduction or prevention of the spurious response due to the Sezawa wave, the improvement of frequency-temperature characteristics, and the reduction in ohmic loss of the interdigital transducer electrode. That is, using a metal with a $C11^2/C12$ ratio greater than the $C11^2/C12$ ratio of silicon oxide included in the dielectric film 4, for the main electrode layer possibly enables the reduction or prevention of the spurious response due to the Sezawa wave, the improvement of frequency-temperature characteristics, and the reduction in ohmic loss of the interdigital transducer electrode.

In the elastic wave device 1, the interdigital transducer electrode 3 includes a plurality of main electrode layers, that is, the first main electrode layer 3a and the second main electrode layer 3b. In this case, preferably, the first main electrode layer 3a is made of Mo and the second main electrode layer 3b is made of Ag, for example. That is, preferably, the first main electrode layer 3a is made of a metal with a $C11^2/C12$ ratio greater than the $C11^2/C12$ ratio of silicon oxide included in the dielectric film 4 and the second main electrode layer 3b is made of a metal with a $C11^2/C12$ ratio less than the $C11^2/C12$ ratio of silicon oxide included in the dielectric film 4.

Figure 16:
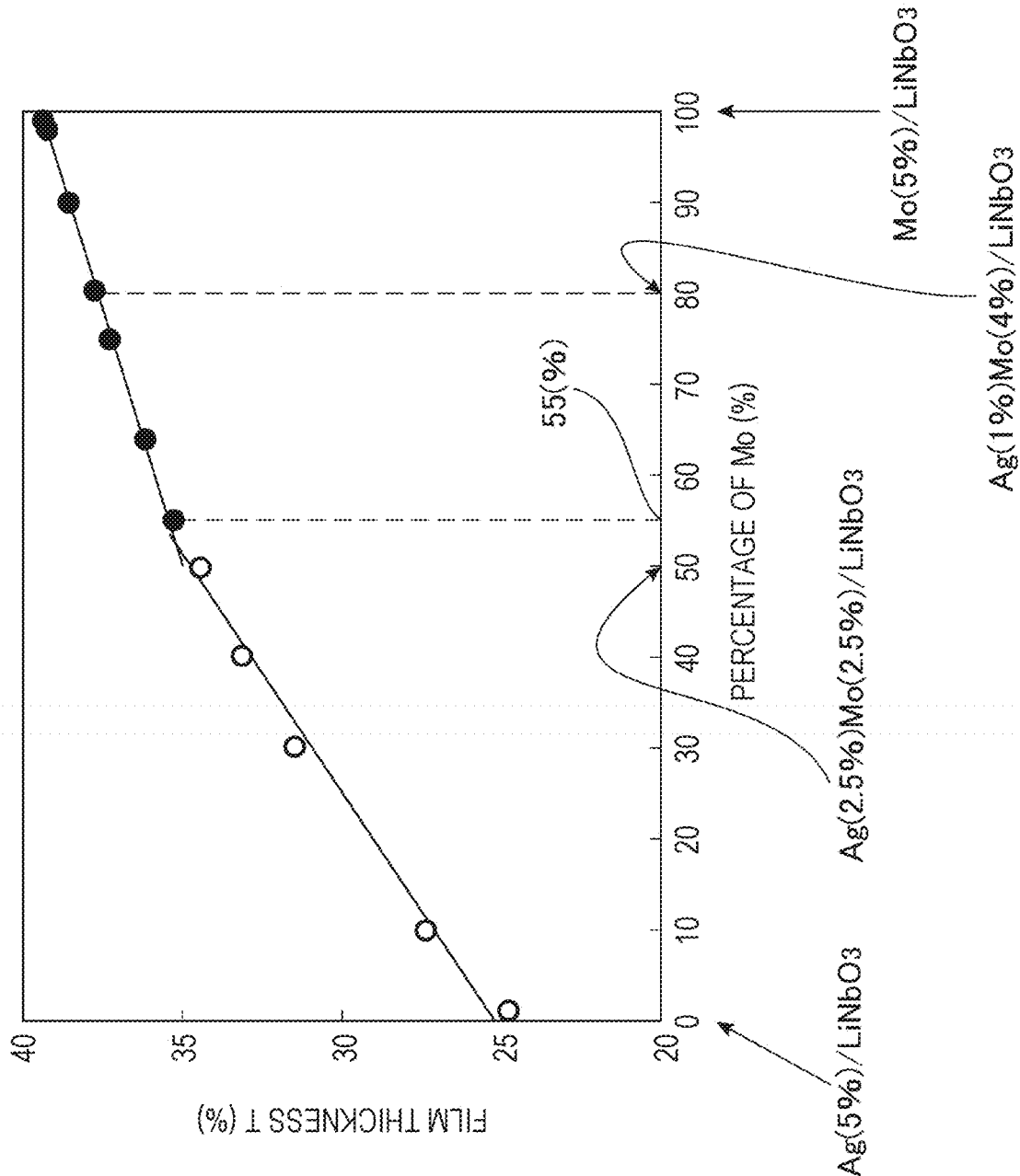
FIG. 16 is a graph showing the relationship between the percentage of Mo and the film thickness T (%) for each SiO₂ film in the case in which an interdigital transducer electrode includes a multilayer metal film including a Mo layer and an Ag layer.

FIG. 16 is a graph showing the relationship between the percentage of Mo in the interdigital transducer electrode 3 and the film thickness T. Herein, the percentage (%) of Mo is the ratio (%) of the thickness of the first main electrode layer 3a, which is made of Mo, to the thickness of the entire interdigital transducer electrode 3. Incidentally, the thickness of the entire interdigital transducer electrode 3 is preferably about 5%, for example, in terms of wavelength-normalized thickness.

As is clear from FIG. 16, the comparison between the case in which the percentage of Mo included in the first main electrode layer 3a is about 55% or more and the case in which the percentage thereof is less than about 55% shows that the film thickness T sharply increases when the percentage of Mo is about 55% or more.

Thus, it is clear that the possibility that the reduction or prevention of the spurious response due to the Sezawa wave and the reduction of the absolute value of the TCF are be both achieved is high because when the percentage of Mo is about 55% or more, the film thickness T is able to be sufficiently increased. That is, in the case in which the interdigital transducer electrode 3 includes the first main electrode layer 3a, which is made of the metal with a $C11^2/C12$ ratio greater than the $C11^2/C12$ ratio of silicon oxide included in the dielectric film 4, and the second main electrode layer 3b, which is made of the metal with a $C11^2/C12$ ratio less than the $C11^2/C12$ ratio of silicon oxide included in the dielectric film 4, and the second main electrode layer 3b is stacked on the first main electrode layer 3a, when the thickness of the first main electrode layer 3a, which is made of the metal with a $C11^2/C12$ ratio greater than the $C11^2/C12$ ratio of silicon oxide included in the dielectric film 4, is about 55% or more based on the thickness of the entire interdigital transducer electrode 3 being about 100%, the film thickness T is able to be sufficiently increased. Therefore, it is clear that the possibility that the reduction or prevention of the spurious response due to the Sezawa wave and the improvement of temperature characteristics are both able to be achieved is high.

Furthermore, when the thickness of the first main electrode layer 3a, which is made of the metal with a $C11^2/C12$ ratio greater than the $C11^2/C12$ ratio of silicon oxide included in the dielectric film 4, is about 55% or more based on the thickness of the entire interdigital transducer electrode 3 being about 100%, the ohmic loss of the interdigital transducer electrode 3 is able to be reduced.

FIG. 16 shows the case in which the first main electrode layer 3a is made of Mo and the second main electrode layer 3b is made of Ag. In contrast, FIG. 17 shows results for the case in which the first main electrode layer 3a, which is located below, is made of Ag and the second main electrode layer 3b, which is located above, is made of Mo.

Figure 17:
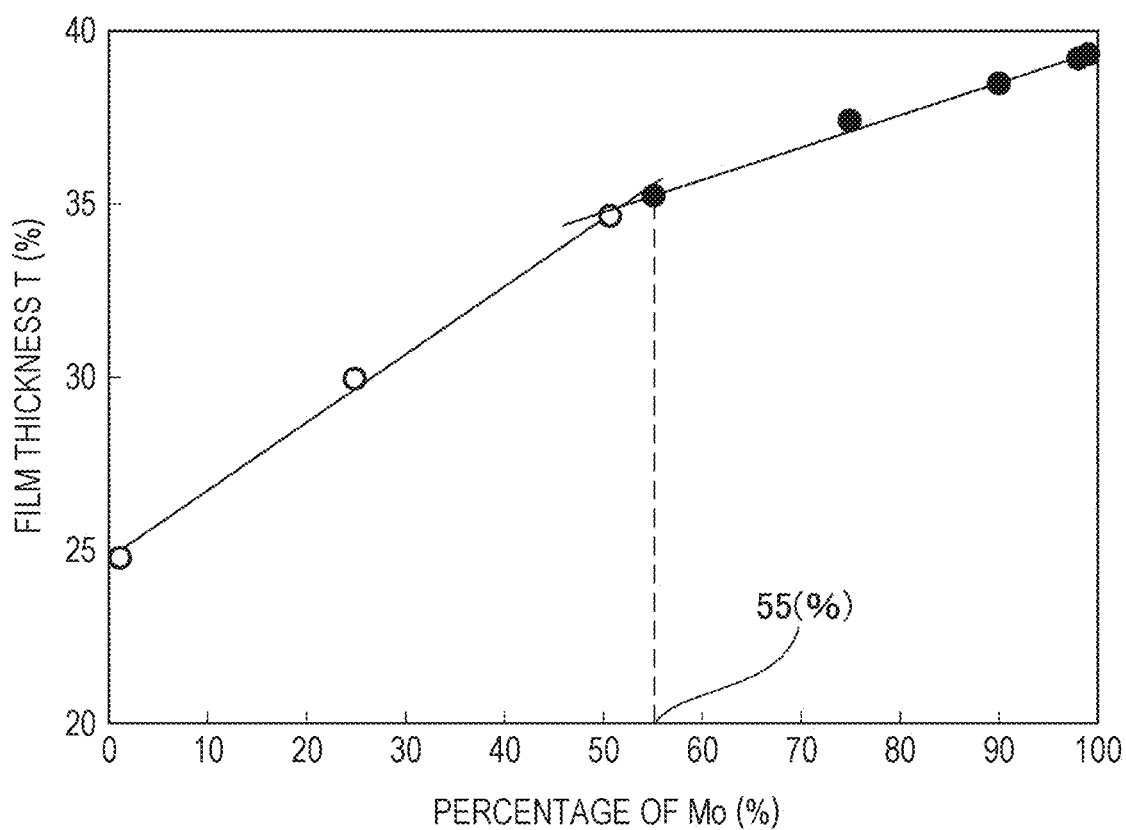
FIG. 17 is a graph showing the relationship between the percentage of Mo and the film thickness T (%) for each SiO₂ film in the case in which an interdigital transducer electrode includes a multilayer metal film including an Ag layer and a Mo layer placed thereon.

As is clear from FIG. 17, in the case in which the second main electrode layer 3b is made of Mo, the comparison between the case in which the percentage of Mo is about 55% or more and the case in which the percentage of Mo is less than about 55% shows that the film thickness T sharply increases when the percentage of Mo is about 55% or more. Thus, in the case in which the first main electrode layer 3a, which is located below, is made of Ag and the second main electrode layer 3b, which is located above, is made of Mo, the percentage of Mo is preferably about 55% or more.

That is, as is clear from FIGS. 16 and 17, in the case in which the interdigital transducer electrode 3 includes the first main electrode layer 3a, which is made of the metal with a $C11^2/C12$ ratio greater than the $C11^2/C12$ ratio of silicon oxide included in the dielectric film 4, and the second main electrode layer 3b, which is made of the metal with a $C11^2/C12$ ratio less than the $C11^2/C12$ ratio of silicon oxide included in the dielectric film 4, when the thickness of the first main electrode layer 3a, which is made of the metal with a $C11^2/C12$ ratio greater than the $C11^2/C12$ ratio of silicon oxide included in the dielectric film 4, is about 55% or more based on the thickness of the entire interdigital transducer electrode 3 being about 100% regardless of the stacking order of the first main electrode layer 3a and the second main electrode layer 3b, the film thickness T is able to be sufficiently increased. Therefore, it is clear that the possibility that the reduction or prevention of the spurious response due to the Sezawa wave and the improvement of temperature characteristics are both able to be achieved is high. Furthermore, when the thickness of the first main electrode layer 3a, which is made of the metal with a $C11^2/C12$ ratio greater than the $C11^2/C12$ ratio of silicon oxide included in the dielectric film 4, is about 55% or more based on the thickness of the whole interdigital transducer electrode 3 being about 100%, the ohmic loss of the interdigital transducer electrode 3 is able to be reduced.

Figure 18:
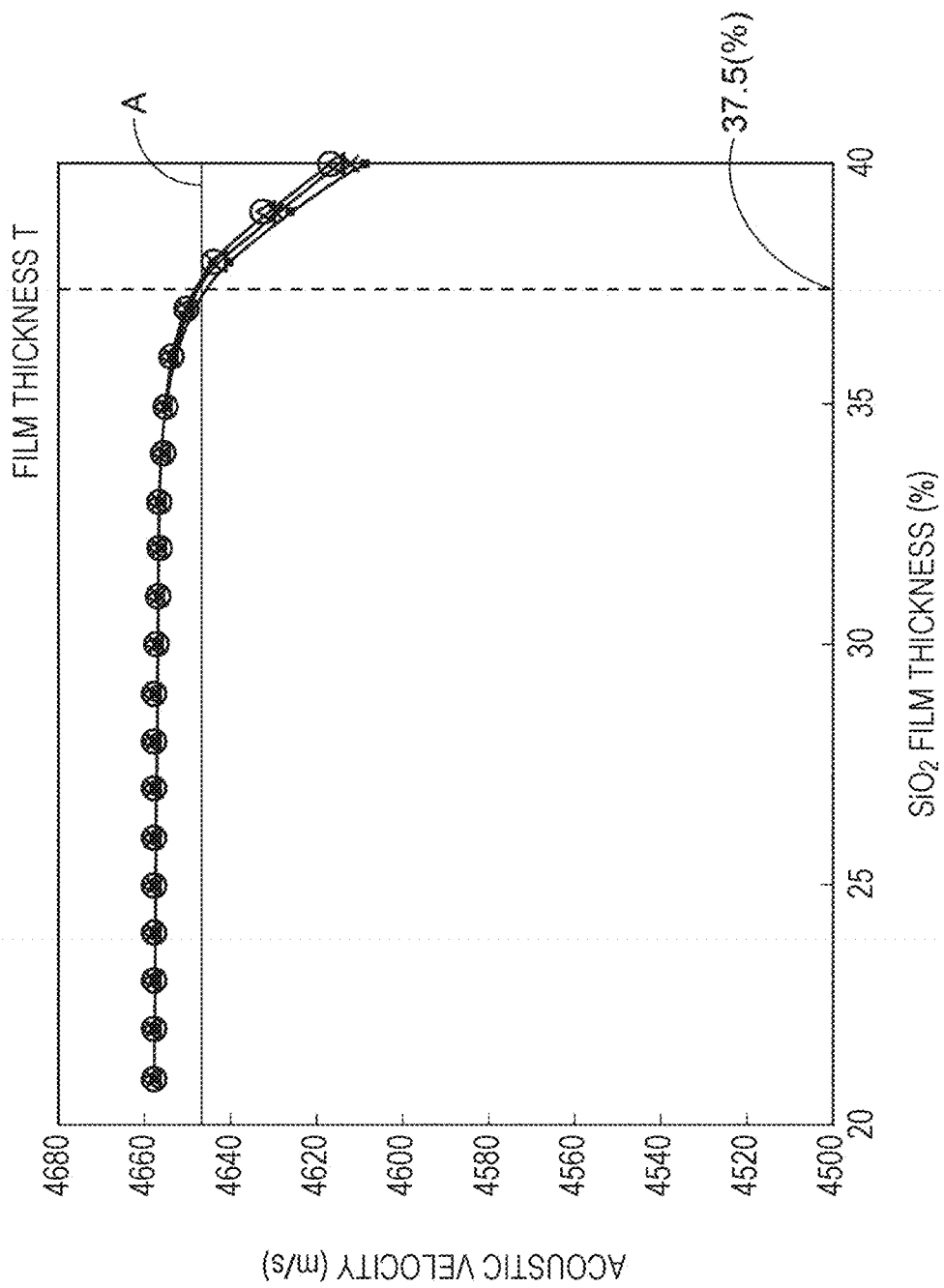
FIG. 18 is a graph showing the relationship between the thickness (%) of each SiO₂ film and the acoustic velocity of a Sezawa wave in the case in which an interdigital transducer electrode includes a Mo layer and an Ag layer and the thickness of the Mo film is about 75% of the thickness of the entire interdigital transducer electrode.

FIG. 18 is a graph showing the relationship between the thickness (%) of each $SiO_2$ film and the acoustic velocity of a Sezawa wave in the case in which the thickness of a Mo film is about 75% of the thickness of an entire interdigital transducer electrode. In FIG. 18, Continuous Line A represents the acoustic velocity VB of a bulk wave. In FIG. 18, results obtained using interdigital transducer electrodes having first to eighth multilayer structures below are plotted. Even when using either of these multilayer structures, the relationship between the thickness (%) of the $SiO_2$ film and the acoustic velocity of the Sezawa wave is substantially unvaried as shown in FIG. 18. Thus, although curves illustrating relationships between the first to eighth multilayer structures should be fundamentally shown in FIG. 18, many of the curves overlap each other as shown in FIG. 18.

The first to eighth multilayer structures below show that metal layers are arranged in order from the upper side to the $LiNbO_3$ side of each interdigital transducer electrode. Each bracketed value in % is the wavelength-normalized thickness. The wavelength-normalized thickness of the whole interdigital transducer electrode is about 5%.

First multilayer structure: Ag layer (about 1%)/Mo layer (about 3.75%)/Ag layer (about 0.25%)

Second multilayer structure: Ag layer (about 0.63%)/Mo layer (about 3.75%)/Ag layer (about 0.63%)

Third multilayer structure: Ag layer (about 0.25%)/Mo layer (about 3.75%)/Ag layer (about 1%)

Fourth multilayer structure: Mo layer (about 3.25%)/Ag layer (about 1.25%)/Mo layer (about 0.5%)

Fifth multilayer structure: Mo layer (about 1.88%)/Ag layer (about 1.25%)/Mo layer (about 1.88%)

Sixth multilayer structure: Mo layer (about 0.5%)/Ag layer (about 1.25%)/Mo layer (about 3.25%)

Seventh multilayer structure: Mo layer (about 3.75%)/Ag layer (about 1.25%)

Eighth multilayer structure: Ag layer (about 1.25%)/Mo layer (about 3.75%)

When the thickness of a Mo film accounts for a large percentage of that of the entire interdigital transducer electrode, it is clear that similar characteristics are exhibited even if the number of main electrode layers of the interdigital transducer electrode is not only two but also three or more.

That is, preferably, when an elastic wave device includes a piezoelectric substrate 2 mainly including lithium niobate, an interdigital transducer electrode 3 provided on the piezoelectric substrate 2, and a dielectric film 4 mainly including silicon oxide and uses a Rayleigh wave; the interdigital transducer electrode 3 includes a plurality of main electrode layers; the plurality of main electrode layers include one or more first main electrode layers made of a metal with a $C11^2/C12$ ratio greater than the $C11^2/C12$ ratio of silicon oxide included in the dielectric film 4 with regard to the elastic constants C11 and C12; and the sum of the thicknesses of the one or more first main electrode layers is about 55% or more based on the thickness of the entire interdigital transducer electrode 3 being about 100%, the spurious response due to a Sezawa wave is able to be reduced or prevented, frequency-temperature characteristics are able to be improved, and the ohmic loss of the interdigital transducer electrode 3 is able to be reduced.

Figure 19:
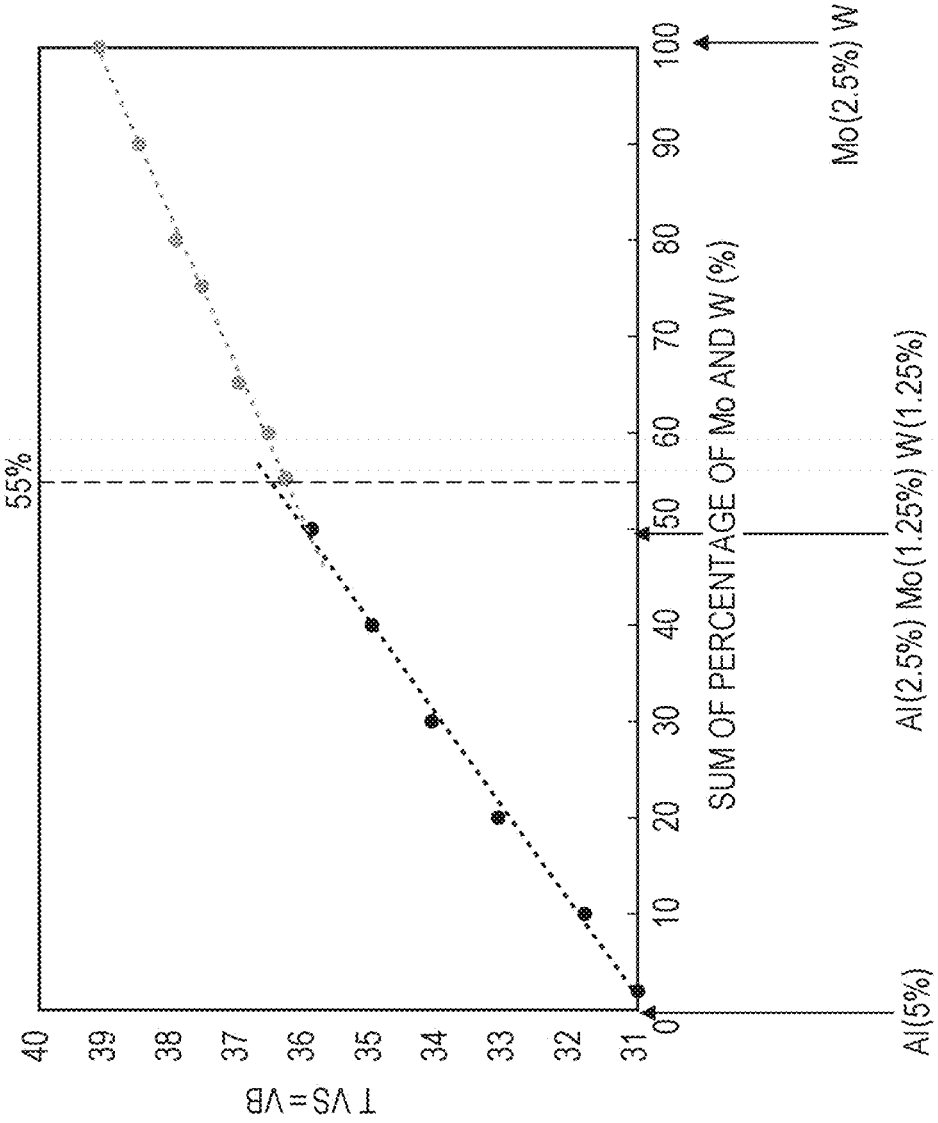
FIG. 19 is a graph showing the relationship between the percentage of W and Mo and the film thickness T (%) for each SiO₂ film in the case in which an interdigital transducer electrode is includes a multilayer metal film including a W layer, a Mo layer, and an Al layer.

FIG. 19 is a graph showing the relationship between the sum of the thicknesses of a main electrode layer W and a main electrode layer Mo and the film thickness T in an elastic wave device 1 in which a first main electrode layer 3a of an interdigital transducer electrode 3 is a multilayer electrode including a main electrode layer made of W and a main electrode layer made of Mo and a second main electrode layer 3b made of Al. In this case, the thickness of the entire interdigital transducer electrode 3 is about 5% in terms of wavelength-normalized thickness. In FIG. 19, the horizontal axis represents the sum of the percentages of the main electrode layer W and the main electrode layer Mo in the entire interdigital transducer electrode 3.

The main electrode layer W and the main electrode layer Mo, which are included in the first main electrode layer 3a, are both made of a metal with a $C11^2/C12$ ratio greater than the $C11^2/C12$ ratio of silicon oxide included in a dielectric film 4, and a main electrode layer Al included in the second main electrode layer 3b is made of a metal with a $C11^2/C12$ ratio less than the $C11^2/C12$ ratio of silicon oxide included in the dielectric film 4.

As is clear from FIG. 19, the comparison between the case in which the thickness of the main electrode layer W and the main electrode layer Mo, included in the first main electrode layer 3a, is about 55% or more and the case in which the thickness thereof is less than about 55% shows that the film thickness T sharply increases when the percentage of the main electrode layer W and the main electrode layer Mo is about 55% or more.

Thus, in the case in which two or more main electrode layers are made of a metal with a $C11^2/C12$ ratio greater than the $C11^2/C12$ ratio of silicon oxide included in a dielectric film 4, when the sum of the thicknesses of the two or more main electrode layers is about 55% or more based on the thickness of the entire interdigital transducer electrode 3 is about 100%, the film thickness T is able to be sufficiently increased. Therefore, it is clear that the possibility that the reduction or prevention of the spurious response due to the Sezawa wave and the improvement of temperature characteristics are both able to be achieved is high. Furthermore, when the sum of the thicknesses of the two or more main electrode layers, which are made of the metal with a $C11^2/C12$ ratio greater than the $C11^2/C12$ ratio of silicon oxide included in a dielectric film 4, is about 55% or more based on the thickness of the whole interdigital transducer electrode 3 being about 100%, the ohmic loss of the interdigital transducer electrode 3 is able to be reduced.

When an interdigital transducer electrode includes a plurality of main electrode layers and all metals included in the multiple main electrode layers are metals producing a straight line with a positive slope as shown in FIG. 13, the reduction or prevention of the Sezawa wave, the improvement of temperature characteristics, and the reduction in ohmic loss of the interdigital transducer electrode are all able to be achieved. This is because all of the metals included in the main electrode layers are metals with a $C11^2/C12$ ratio greater than the $C11^2/C12$ ratio of silicon oxide included in the dielectric film 4.

Figure 21:
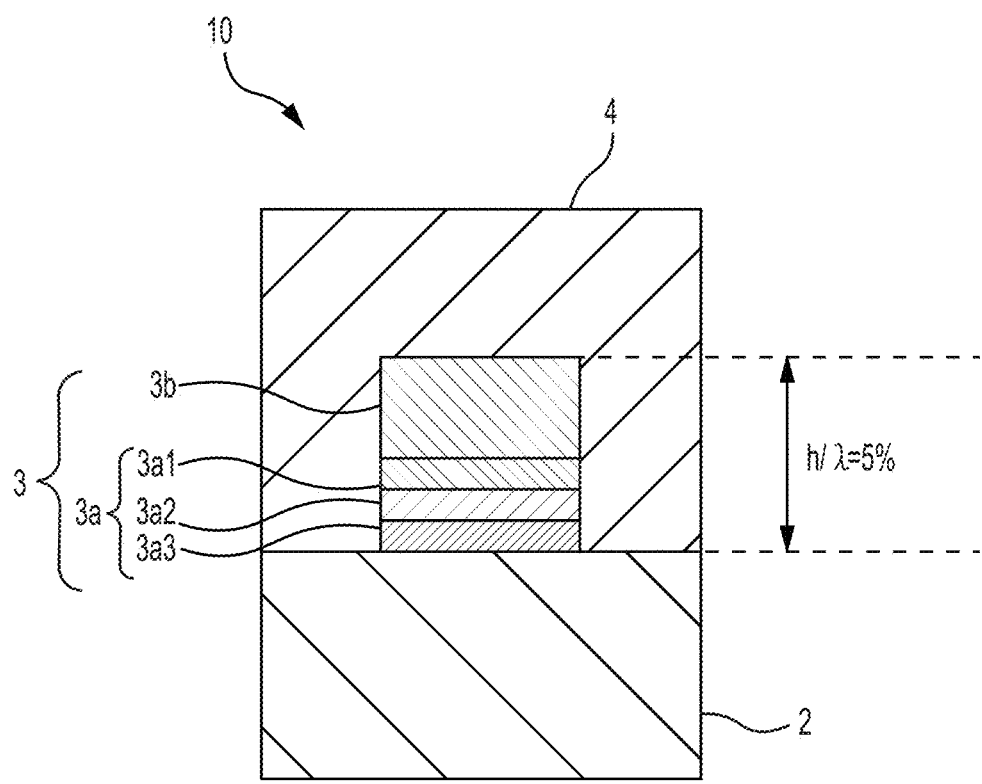
FIG. 21 is a plan view of an elastic wave device according to a preferred embodiment of the present invention including a first main electrode layer including multiple electrode layers.

Combinations below are described as a combination of such main electrode layers. In the case of a two-layer structure, the following combinations, for example, are preferably used: a combination of a layer made of Cu and a layer made of Mo, a combination of a layer made of Ta and a layer made of Cu, a combination of a layer made of Cu and a layer made of W, a combination of a layer made of Pt and a layer made of Cu, and a combination of a layer made of Pt and a layer made of Mo. In the case of a three-layer structure, the following combinations, for example, are preferably used: a combination of a layer made of Mo, a layer made of Cu, and a layer made of Mo; a combination of a layer made of W, a layer made of Cu, and a layer made of W; a combination of a layer made of Pt, a layer made of Cu, and a layer made of Pt; a combination of a layer made of Pt, a layer made of Mo, and a layer made of Pt; a combination of a layer made of Cu, a layer made of W, and a layer made of Cu; and a combination of a layer made of Cu, a layer made of Mo, and a layer made of Cu. However, in at least two main electrode layers, a combination of main electrode layers made of preferable metals is not limited to the above combinations. FIG. 21 shows an elastic wave device 10 including an interdigital transducer electrode 3 including a first main electrode layer 3a, that is a multilayer structure including three first main electrode layers 3a1, 3a2, and 3a3, and a second main electrode layer 3b.

Figure 20:
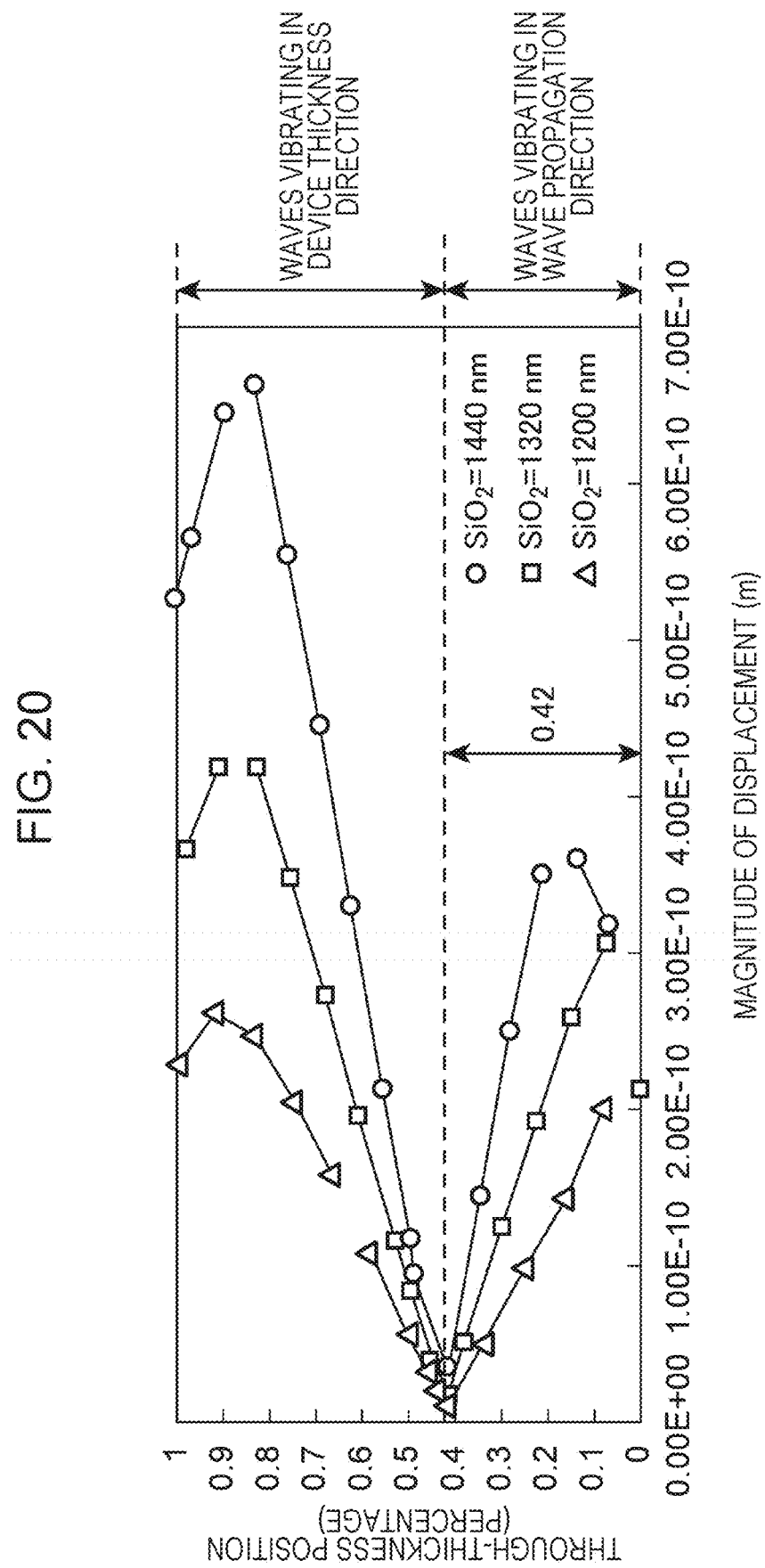
FIG. 20 is a schematic view showing the fluctuation (the maximum minus the minimum) of the magnitude of displacement due to a Sezawa wave at the through-thickness position of each SiO₂ film on the basis that the thickness of the SiO₂ film is about 100%.

FIG. 20 is a graph showing the relationship between the through-thickness position of each $SiO_2$ film and the magnitude of displacement. The piezoelectric substrate 2 is made of $LiNbO_3$ with Euler angles (about 0°, about 37.5°, about 0°). The magnitude of displacement in FIG. 20 is determined as the magnitude of displacement in the length of one wave in the propagation direction of an interdigital transducer electrode. In particular, the magnitude of displacement is determined and the maximum minus the minimum is set to the magnitude of displacement. In FIG. 20, the vertical axis represents a through-thickness position and the through-thickness position is a normalized value. In FIG. 20, A represents the case in which the thickness of a $SiO_2$ film is about 1,200 nm, □ represents the case in which the thickness of a $SiO_2$ film is about 1,320 nm, and ○ represents the case in which the thickness of a $SiO_2$ film is about 1,440 nm. The through-thickness position is expressed by normalizing three types of thickness levels. In FIG. 20, a through-thickness position of about 0 represents the interface between the piezoelectric substrate 2 and a $SiO_2$ film.

As is clear from FIG. 20, when the through-thickness position is about 0.42 or less, that is, about 42% or less of the thickness of a $SiO_2$ film, a wave vibrating in the propagation direction of the wave, that is, a longitudinal wave is fluctuating. It is clear that in an area higher than this, a wave vibrates in the thickness direction of the elastic wave device 1, that is, the thickness direction of the $SiO_2$ film. Thus, it is clear that a metal which has a $C11^2/C12$ ratio greater than the $C11^2/C12$ ratio of silicon oxide included in the dielectric film 4 and which is included in one or more main electrode layers included in the interdigital transducer electrode 3 is preferably provided at a position within about 42% of the thickness of the $SiO_2$ film from the piezoelectric substrate 2 side, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate including lithium niobate;
an interdigital transducer electrode provided on the piezoelectric substrate; and
a dielectric film provided on the piezoelectric substrate and covering the interdigital transducer electrode, and including silicon oxide; wherein
the interdigital transducer electrode includes a plurality of main electrode layers, the plurality of main electrode layers include one or more first main electrode layer made of a metal with a $C11^2/C12$ ratio greater than a $C11^2/C12$ ratio of the silicon oxide with regard to elastic constants C11 and C12, and a sum of thicknesses of the one or more first main electrode layer is about 55% or more based on a thickness of an entirety of the interdigital transducer electrode being about 100%.

2. The elastic wave device according to claim 1, wherein the metal included in the one or more first main electrode layer is at least one metal selected from the group consisting of Mo, W, Cu, and Fe.

3. The elastic wave device according to claim 2, wherein the metal included in the one or more first main electrode layer is Mo.

4. The elastic wave device according to claim 1, wherein a number of the one or more first main electrode layer is two or more; and
the two or more first main electrode layers are made of metals that are two or more metals selected from the group consisting of Ta, Pt, Mo, W, Cu, and Fe.

5. The elastic wave device according to claim 4, wherein the two or more first main electrode layers include a combination of a layer made of Cu and a layer made of Mo.

6. The elastic wave device according to claim 4, wherein the two or more first main electrode layers include a combination of a layer made of Ta and a layer made of Cu.

7. The elastic wave device according to claim 4, wherein the two or more first main electrode layers include a combination of a layer made of Cu and a layer made of W.

8. The elastic wave device according to claim 4, wherein the two or more first main electrode layers include a combination of a layer made of Pt and a layer made of Cu.

9. The elastic wave device according to claim 4, wherein the two or more first main electrode layers include a combination of a layer made of Pt and a layer made of Mo.

10. The elastic wave device according to claim 4, wherein the two or more first main electrode layers include three or more layers including a combination of a layer made of Mo, a layer made of Cu, and a layer made of Mo.

11. The elastic wave device according to claim 4, wherein the two or more first main electrode layers include three or more layers including a combination of a layer made of W, a layer made of Cu, and a layer made of W.

12. The elastic wave device according to claim 4, wherein the two or more first main electrode layers include three or more layers including a combination of a layer made of Pt, a layer made of Cu, and a layer made of Pt.

13. The elastic wave device according to claim 4, wherein the two or more first main electrode layers include three or more layers including a combination of a layer made of Pt, a layer made of Mo, and a layer made of Pt.

14. The elastic wave device according to claim 4, wherein the two or more first main electrode layers include three or more layers including a combination of a layer made of Cu, a layer made of W, and a layer made of Cu.

15. The elastic wave device according to claim 4, wherein the two or more first main electrode layers include three or more layers including a combination of a layer made of Cu, a layer made of Mo, and a layer made of Cu.

16. The elastic wave device according to claim 1, wherein a number of the main electrode layers is three or more; the main electrode layers further include:
a second main electrode layer made of a metal which is different from the metal of the one or more first main electrode layers and which is at least one metal selected from the group consisting of Mo, W, Cu, and Fe; and
a third main electrode layer which is provided on a side of the second main electrode layer that is opposite to the one or more first main electrode layers and which is made of a same metal as the metal of the one or more first main electrode layers; and
the one or more first main electrode layer is made of at least one metal selected from the group consisting of Mo, W, and Cu.

17. The elastic wave device according to claim 1, wherein the elastic wave device uses a Rayleigh wave.

18. The elastic wave device according to claim 1, wherein the plurality of main electrode layers further include a second main electrode layer made of a metal with a $C11^2/C12$ ratio less than the $C11^2/C12$ ratio of the silicon oxide and the second main electrode layer is made of at least one metal selected from the group consisting of Ag, Al, and Au.

19. The elastic wave device according to claim 1, wherein a number of the plurality of main electrode layers is two, the metal of the one or more first main electrode layer is Mo and the metal of the second main electrode layer is Ag.

20. The elastic wave device according to claim 1, wherein the one or more first main electrode layer is provided at one or more positions within about 42% of a thickness of the dielectric film from the piezoelectric substrate side.

* * * * *